US010840214B2

(12) United States Patent
Arvin et al.

(10) Patent No.: US 10,840,214 B2
(45) Date of Patent: Nov. 17, 2020

(54) CARRIER AND INTEGRATED MEMORY

(71) Applicant: International Business Machines Corporation, Armonk, NY (US)

(72) Inventors: Charles L. Arvin, Poughkeepsie, NY (US); Brian M. Erwin, Millbrook, NY (US); Mark W. Kapfhammer, Poughkeepsie, NY (US); Brian W. Quinlan, Poughkeepsie, NY (US); Charles L. Reynolds, Red Hook, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/546,802

(22) Filed: Aug. 21, 2019

(65) Prior Publication Data

US 2019/0378816 A1    Dec. 12, 2019

Related U.S. Application Data

(63) Continuation of application No. 15/948,023, filed on Apr. 9, 2018, now Pat. No. 10,515,929.

(51) Int. Cl.
*H01L 23/52* (2006.01)
*H01L 21/56* (2006.01)
(Continued)

(52) U.S. Cl.
CPC .............. *H01L 25/065* (2013.01); *H01L 23/13* (2013.01); *H01L 23/5384* (2013.01); *H01L 23/5385* (2013.01); *H01L 25/50* (2013.01)

(58) Field of Classification Search
CPC ............. H01L 25/0652; H01L 23/5385; H01L 23/5386; H01L 23/49816; H01L 24/16;
(Continued)

(56) References Cited

U.S. PATENT DOCUMENTS

| 2011/0042795 A1* | 2/2011 | Knickerbocker ..... H01L 23/481 257/686 |
| 2011/0068459 A1 | 3/2011 | Pagaila et al. |

(Continued)

OTHER PUBLICATIONS

S. Chen et al., "A Comparative Study of a Fan Out Packaged Product: Chip First and Chip Last," 66th Electronic Components and Technology Conference, ECTC, 2016, pp. 1483-1488.
(Continued)

*Primary Examiner* — Brian Turner
(74) *Attorney, Agent, or Firm* — ZIP Group PLLC

(57) ABSTRACT

An integrated circuit (IC) chip carrier includes one or more memory devices therein. The memory is integrated into the carrier prior to the IC chip being connected to the carrier. Therefore, the IC chip may be connected to the memory at the same time as the IC chip is connected to the carrier. An access instruction may be sent from the IC chip to the memory through a wiring line of the IC chip carrier. Power potential may be sent from a system board to the memory through a vertical interconnect access (VIA). Alternatively, an access instruction may be sent from a first IC chip to the memory and power potential may be sent from a second IC chip to the memory.

5 Claims, 14 Drawing Sheets

(51) Int. Cl.
*H01L 25/065* (2006.01)
*H01L 23/522* (2006.01)
*H01L 23/13* (2006.01)
*H01L 25/00* (2006.01)
*H01L 23/538* (2006.01)

(58) Field of Classification Search
CPC ......... H01L 24/32; H01L 24/73; H01L 24/96; H01L 21/561; H01L 21/568; H01L 24/27; H01L 25/50; H01L 21/6835; H01L 23/5381; H01L 2221/68359; H01L 2224/73203; H01L 2224/16148; H01L 2224/16238; H01L 2224/16268; H01L 2224/32148; H01L 2224/32238; H01L 2224/32268; H01L 2224/2711; H01L 2224/29147; H01L 2224/27334
See application file for complete search history.

(56) References Cited

U.S. PATENT DOCUMENTS

| | | |
|---|---|---|
| 2011/0227209 A1 | 9/2011 | Yoon et al. |
| 2012/0001339 A1* | 1/2012 | Malatkar ........... H01L 23/49838 257/773 |
| 2012/0126388 A1 | 5/2012 | Lin et al. |
| 2013/0111123 A1* | 5/2013 | Thayer ................... G06F 13/16 711/105 |
| 2013/0343022 A1 | 12/2013 | Hu et al. |
| 2014/0091445 A1 | 4/2014 | Teh et al. |
| 2014/0103488 A1 | 4/2014 | Chen et al. |
| 2014/0217586 A1 | 8/2014 | Kim et al. |
| 2015/0001731 A1* | 1/2015 | Shuto ..................... H01L 25/18 257/774 |
| 2015/0021754 A1 | 1/2015 | Lin et al. |
| 2015/0130046 A1 | 5/2015 | Lin et al. |
| 2015/0364422 A1 | 12/2015 | Zhai et al. |
| 2016/0064300 A1 | 3/2016 | Lin et al. |
| 2016/0300815 A1* | 10/2016 | Kim ..................... H01L 25/0657 |
| 2017/0350933 A1 | 12/2017 | Uematsu et al. |
| 2018/0277512 A1 | 9/2018 | Waidhas et al. |
| 2019/0310431 A1* | 10/2019 | Patel ..................... G02B 6/2804 |

OTHER PUBLICATIONS

S. Y. Hou et al., "Wafer-Level Integration of an Advanced Logic-Memory System Through the Second-Generation CoWoS Technology," IEEE Transactions on Electron Devices, vol. 64, No. 10, 2017, pp. 4071-4077.

List of IBM Patents or Patent Applications Treated as Related, dated herewith.

* cited by examiner

CARRIER AND INTEGRATED MEMORY

FIELD

Embodiments of invention generally relate to semiconductor chip packaging. More particularly, embodiments relate to an integrated circuit (IC) chip carrier that has an integral memory.

BACKGROUND

There is a need to place memory close to integrated circuit (IC) chips, such as processors, or the like, for the memory and IC chip to be connected by relatively short wiring. A known technique to solve this issue is to attach memory to the semiconductor chip prior to attaching that chip to a chip carrier or to a system board. An issue with this technique is that one is subjecting the IC chip to multiple unreliable processes associated with the attachment of the memory. If a reliability concern results from attaching the memory to the chip, prior to attaching the semiconductor chip to the higher-level package or system, the entire and otherwise reliable chip may need to be discarded.

SUMMARY

In an embodiment of the present invention, a method of accessing a memory within an integrated circuit (IC) device carrier is presented. The method includes sending, with an IC device connected to the top surface of the IC device carrier, an access instruction to store data within memory to a signal contact of the memory upon a wiring line within the IC device carrier. The method further includes providing, with a system board connected to the bottom surface of the IC device carrier, power potential to a power contact of the memory upon a vertical interconnect access (VIA) through the IC device carrier.

In another embodiment of the present invention, a method of accessing a memory within an integrated circuit (IC) device carrier is presented. The method includes receiving, with an IC device connected to the top surface of the IC device carrier, data from a signal contact of the memory by way of a wiring line within the IC device carrier. The method further includes providing, with a system board connected to the bottom surface of the IC device carrier, power potential to a power contact of the memory upon a vertical interconnect access (VIA) through the IC device carrier.

In another embodiment of the present invention, a method of accessing a memory within an integrated circuit (IC) device carrier is presented. The method includes sending, with a first IC device connected to the top surface of the IC device carrier, an access instruction to store data within the memory to a signal contact of the memory. The method further includes providing, with a second IC device connected to the top surface of the IC device carrier, power potential to a power contact of the memory.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention relate to an IC chip carrier, which may also be referred to herein as a carrier, that includes one or more integrated memory devices therein. The memory is integrated into the carrier prior to the IC chip being connected to the carrier. Therefore, the IC chip may be connected to the memory at the same time as the IC chip is connected to the carrier. Because the memory is integrated into the IC chip carrier, prior to the IC chip being attached thereto, reliability concerns that result from attaching the memory to the IC chip carrier affect the IC chip carrier and do not affect the yield of the relatively more expensive IC chip.

Referring now to the figures, wherein like components are labeled with like numerals, exemplary structures of a semiconductor device, in accordance with embodiments of the present invention are shown and will now be described in greater detail below. The specific number of components depicted in the figures and the cross-section orientation was chosen to best illustrate the various embodiments described herein.

Figure 1:
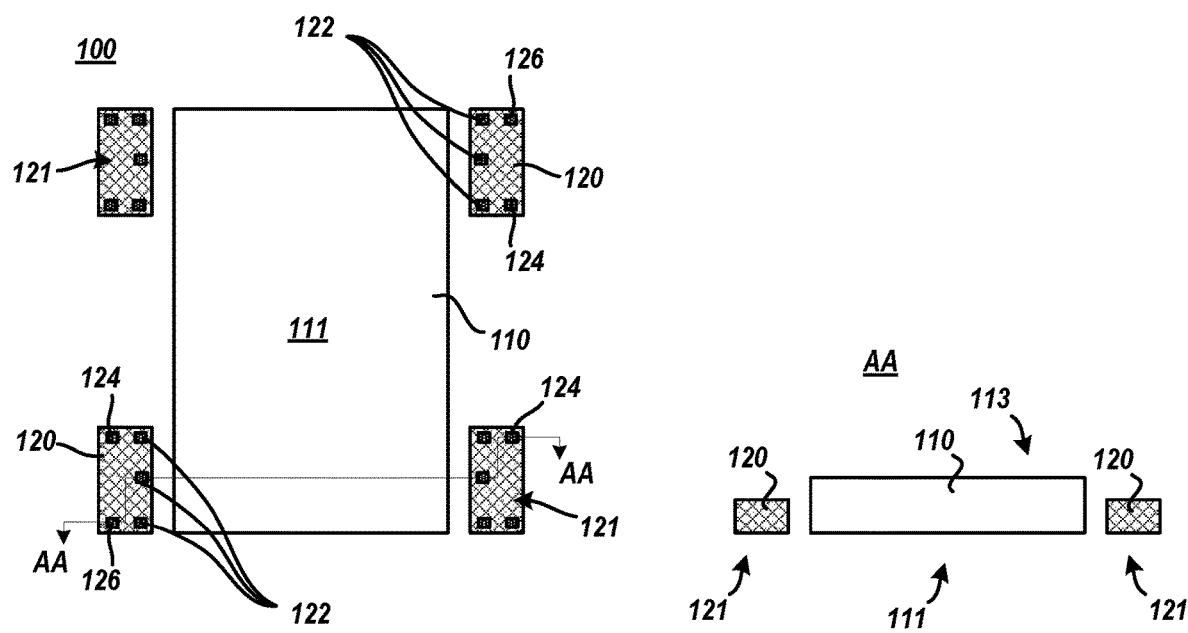
FIG. 1 depicts views of an exemplary integrated memory IC chip carrier fabrication stage, in accordance with one or more embodiments of the present invention.

FIG. 1 depicts views of an exemplary integrated memory IC chip carrier 100 at an initial fabrication stage. At the present fabrication stage carrier 100 includes carrier 110 and one or more memories 120. Carrier 110 is generally a flip chip, also known as controlled collapse chip connection or C4 carrier. Carrier 100 is configured, as is described herein, to attach to the IC chip on carrier 110 chip surface 111 and is configured to attach to a system on carrier 110 system surface 113. Memory 120 is a device that stores data. In embodiments, memory 120 may be high bandwidth memory (HBM) device, a dynamic random access memory (DRAM) device, static random access memory (SRAM) device, or a solid state memory, such as a Flash memory device.

Memory 120 includes interconnects (e.g., contacts, pads, or the like) that allow for other electronic devices to connect thereto, such as power contacts 126 that are connected to a potential distribution circuit system within memory 120, ground contacts 124 that are connected to a ground distribution circuit system within memory 120, or input and/or output (I/O) contacts 122 that are connected to storage circuits that are between the potential distribution system and the ground distribution system within memory 120. The interconnects may be located on a contact surface 121 of memory 120.

One view of FIG. 1 depicts chip surface 111 of carrier 110, respective contact surfaces 121 of different memories 120, and a plane AA through a left memory 120 to the left of carrier 110, through carrier 110, and through a right memory to the right of carrier 110. An IC chip and carrier 110 may be positioned relative thereto so that chip surface 111 faces the IC chip and that the system surface 113 faces the higher level system, such as a motherboard. Another view of FIG. 1 depicts a cross section of carrier 110, memory 120, and the stiffer and heat spreader at plane AA.

Figure 2:
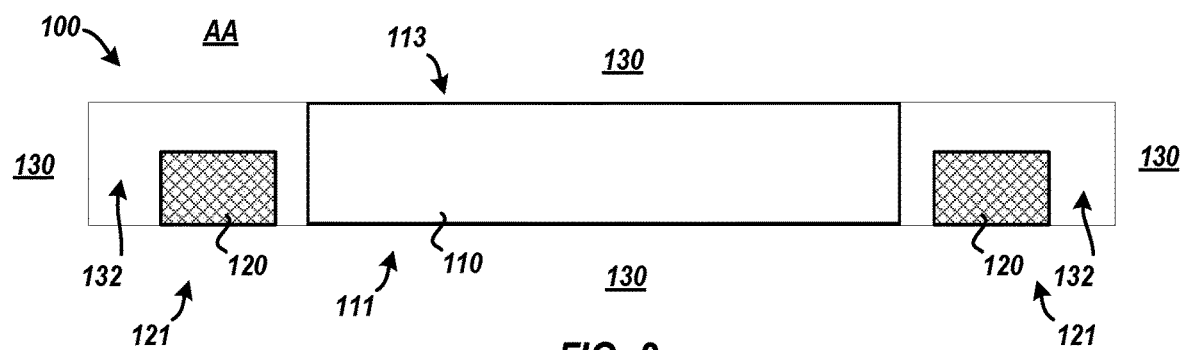
FIG. 2-FIG. 7 depict cross section view of exemplary integrated memory IC chip carrier fabrication stages, in accordance with one or more embodiments of the present invention.

FIG. 2 depicts a cross section view AA of integrated memory IC chip carrier 100 at a subsequent fabrication stage. At the present fabrication stage, carrier 110 and one or more memories 120 are positioned relative thereto within a form 130. The memory 120 and the carrier 110 may be positioned relative thereto so that contact surface 121 of memory 120 and the chip surface 111 of carrier 110 are coplanar. Similarly, the memory 120 and the carrier 110 may be positioned relative thereto so that signal contacts 122 are nearest carrier 110. The contact surface 121 of memory 120 and the chip surface 111 of carrier 110 may be placed upon a lower internal surface of form 130. Form 130 includes an internal void or voids 132 that accept injected material.

Figure 3:
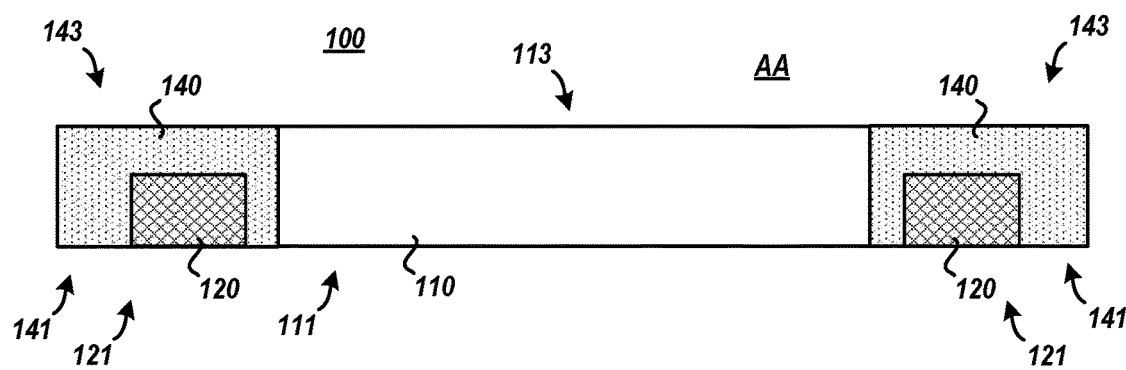

FIG. 3 depicts a cross section view AA of integrated memory IC chip carrier 100 at a subsequent fabrication stage. At the present fabrication stage, material 140 that is injected into voids 132 mechanically connects memory 120 and carrier 110. Material 140 may surround memory 120 on all sides but for contact surface 121. Likewise, material 140 may surround carrier 110 on all sides but for chip surface 111 and system surface 113 of carrier 110. Material 140 has a surface 141 that may be coplanar with contact surface 121 and/or chip surface 111. Similarly, material 140 has a surface 143 that may be coplanar with system surface 113.

Material 140 may be a dielectric material, such as a plastic, or the like. During the injection of material 140 into form 130, additives, known in the art, may be added so that material 140 with the additives has a coefficient of thermal expansion (CTE) similar (i.e. within ten percent, or the like) or the same as the CTE of carrier 110.

Figure 4:
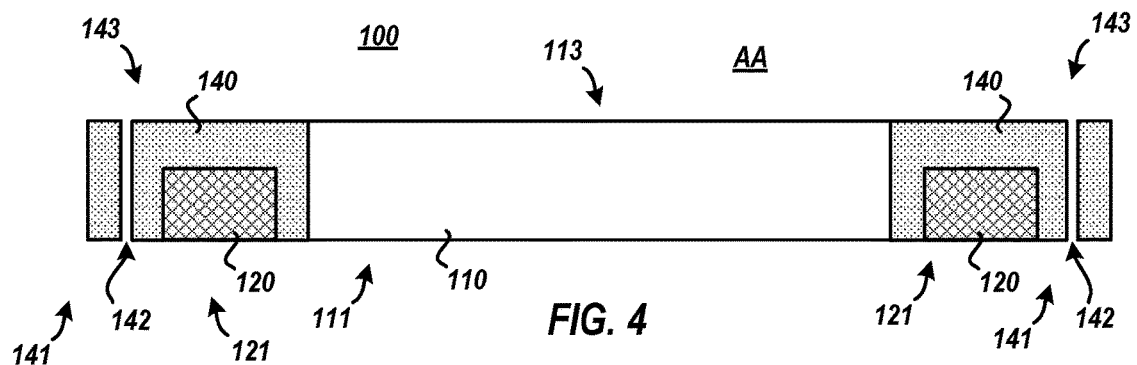

FIG. 4 depicts a cross section view AA of integrated memory IC chip carrier 100 at a subsequent fabrication stage. At the present fabrication stage, one or more vertical interconnect access (VIA) holes 142 are formed within material 140 to the outside of memory 120 relative to carrier 110. For example, circular holes 142 are drilled from the surface 141 to the surface 143 in the plane of power contacts 124 and ground contacts 126 in material 140

Figure 5:
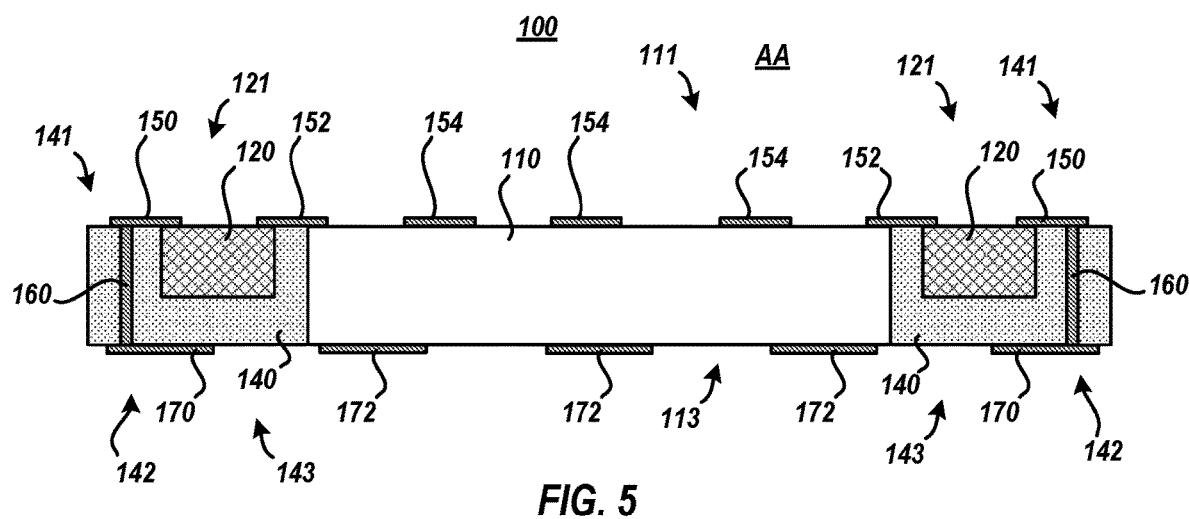

FIG. 5 depicts a cross section view AA of integrated memory IC chip carrier 100 at a subsequent fabrication stage. At the present fabrication stage interconnects are formed. These interconnects are electrically conductive pathways and may be contacts, pads, vias, or the like.

Interconnects may be formed upon the chip facing surfaces of material 140, memory 120, and carrier 110. For example, contacts 154 may be formed upon chip surface 111. Likewise, contacts 152 may be formed upon chip surface 111, upon surface 141, upon surface 121, and upon signal contact 122 of memory 120. Similarly, VIAs 160 may be formed within holes 142. Likewise, contacts 150 may be formed upon surface 141, upon a respective VIA 160, upon surface 121, and upon power contact 126 or ground contact 124 of memory 120.

Interconnects may also be formed upon system facing surfaces of material 140 and carrier 110. For example, contacts 172 may be formed upon system surface 113. Likewise, contacts 170 may be formed upon surface 143 and upon a respective VIA 160. As such, one contact 170 is interconnected with one contact 150 by one VIA 160.

Such interconnects may be formed by known fabrication techniques. For example, a dielectric layer may be formed upon the IC chip facings surface of carrier 100 and upon the system facing surfaces of carrier 100. The dialectic layers may be patterned, or in other words, openings may be formed therein where the interconnects are to be formed. The interconnects may be formed within the openings via sputtering, plating, or other known deposition techniques. The dielectric layers are removed leaving the formed interconnects upon the IC chip facings surface of carrier 100 and formed upon the system facing surfaces of carrier 100. The formation of the various interconnects may be completed in stages. For example, VIAs 160 may be formed prior to contacts 150, 152, 154, 170, and/or 172. Likewise, contacts 154, 172 may be formed prior to or after contacts 150, 152, 170. Though a finite number of interconnects are depicted, carrier 100 may include a greater number of interconnects than the number depicted. When viewing carrier 110 normal to surface 111, the shape of contacts 150, 152, 154 may be polygonal (i.e., square, rectangular, or the like). Similarly, when viewing carrier 110 normal to surface 113, the shape of contacts 170, 172, may also be polygonal. In some embodiments, contacts 152, 154, and 172 may be connected to circuit wiring lines within carrier 110.

Figure 6:
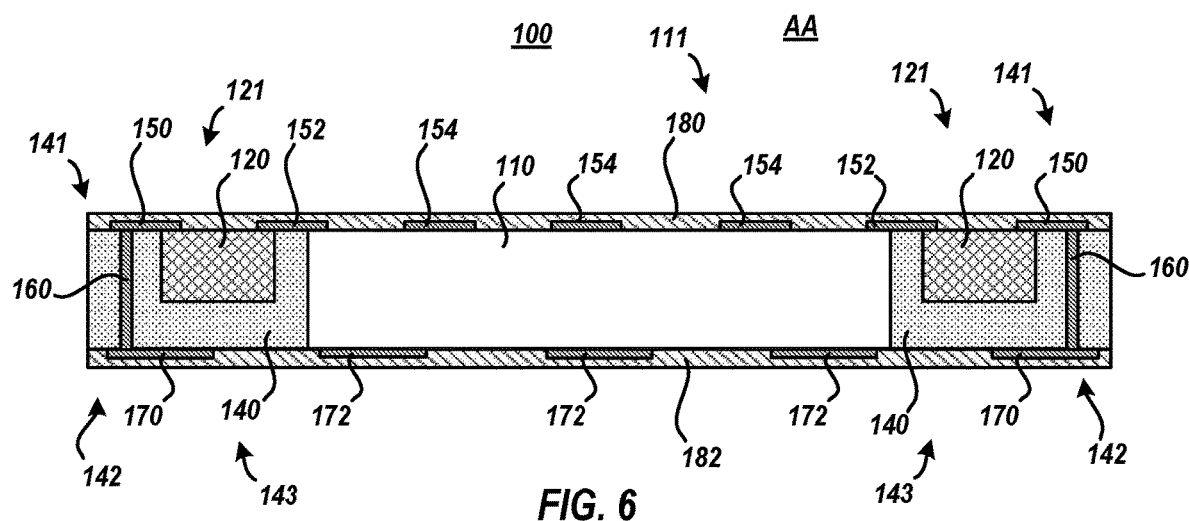

FIG. 6 depicts a cross section view AA of integrated memory IC chip carrier 100 at a subsequent fabrication stage. At the present fabrication stage, a solder mask 180 is formed upon chip facing surfaces of material 140, memory 120, and carrier 110 and is formed surrounding contacts 150, 152, and 154. In other words, solder mask 180 may blanket cover the features of carrier 100 on the side of carrier 100 that faces the IC chip. At the present fabrication stage, a solder mask 182 is formed upon system facing surfaces of material 140 and carrier 110 and is formed surrounding contacts 170 and 172. In other words, solder mask 182 may blanket cover the features of carrier 100 on the side of carrier 100 that faces the system.

Figure 7:
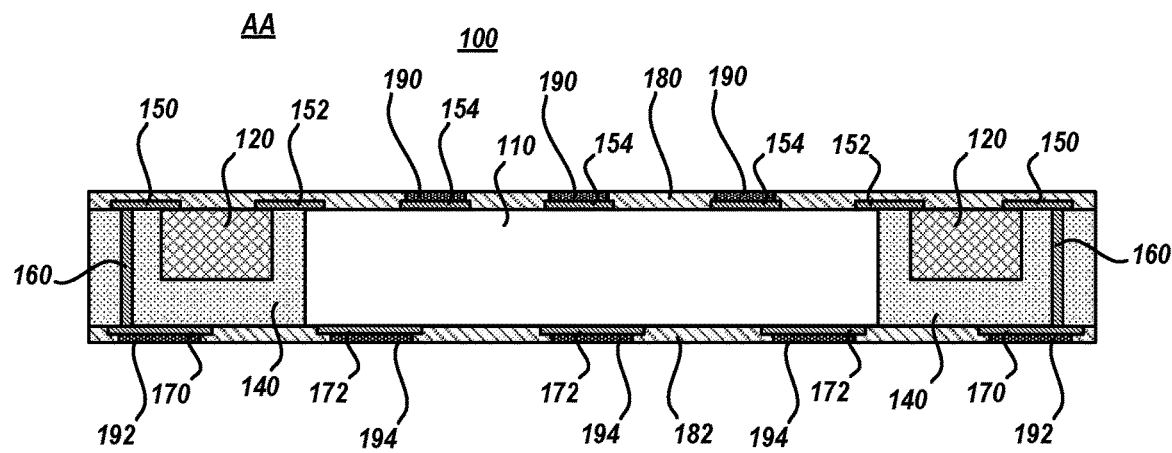

FIG. 7 depicts a cross section view AA of integrated memory IC chip carrier 100 at a subsequent fabrication stage. At the present fabrication stage, solder masks 180, 182 are opened in line with contacts 154, 170, and 172 and pre-solder material is formed within the openings. For example, openings within solder mask 180 are formed above contacts 154 and openings within solder mask 182 are formed below contacts 170 and 172. Subsequently, pre-solder material 190 is formed within the openings in line with contacts 154, pre-solder material 192 is formed within the openings in line with contacts 170, and pre-solder material 194 is formed within the openings inline with contacts 172. For clarity, the fabrication stages depicted in FIG. 6 and FIG. 7 may be optional in implementations of carrier 100 that connect to the IC chip or system by non-solder type interconnects, such as fuzzy buttons, posts, grid, or the like.

Figure 8:
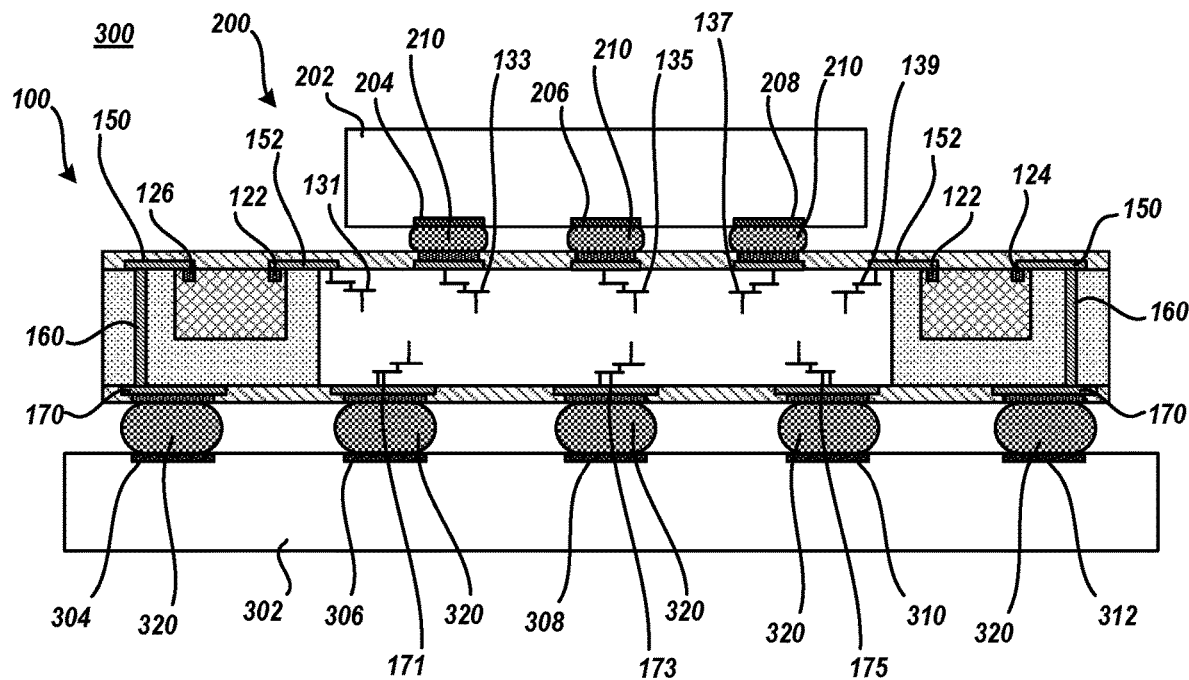
FIG. 8 depicts a cross section view of an exemplary integrated memory IC chip carrier within a higher-level IC chip package or within a higher level electronic system, in accordance with one or more embodiments of the present invention.

FIG. 8 depicts a cross section view of integrated memory IC chip carrier 100 within IC chip package 200 or within a system 300. IC chip package 200 includes carrier 100 connected to IC chip 202. System 300 includes IC chip package 200 connected to a system board 302.

IC chip 202 may be connected to carrier 100 by interconnects 210, such as solder, C4 solder, buttons, posts, or the like that connect a contact of the IC chip 202 to pre-solder 190 or, if no pre-solder 190 is present, directly to contact 154 of carrier 100. For example, as depicted, IC chip contact 204 is connected to pre-solder 190 by C4 solder interconnect 210, IC chip contact 206 is connected to pre-solder 190 by C4 solder interconnect 210, and IC chip contact 208 is connected to pre-solder 190 by C4 solder interconnect 210.

IC chip contact 204 may be electrically connected to wiring 133 within carrier 110 by way of its contact 154, IC chip contact 206 is electrically connected to wiring 135 within carrier 110 by way of its contact 154, and IC chip contact 208 is electrically connected to wiring 137 within carrier 110 by way of its contact 154. Wiring 131 may be electrically connected with contact 152 that is connected to one memory 120. Similarly, wiring 139 is electrically connected with contact 152 that is connected to another memory 120. At least one of the wiring lines 133, 135, and/or 137 may be connected to wiring line 131. Similarly, at least one of the wiring lines 133, 135, and/or 137 may be electrically connected to wiring line 139. Therefore, to access the left memory 120, IC chip 202 may send an access instruction or signal from the appropriate contact 204, 206, 208 to contact 122 by way of wiring line 131 and to access the right memory 120, IC chip 202 may send an access instruction or signal from the appropriate contact 204, 206, 208 to contact 122 by way of wiring line 139.

IC chip package 200 may be connected to system board 302 by interconnects 320, such as solder, solder, buttons, posts, or the like that connect a contact of the system board 302 to pre-solder 192, 194 or, if no pre-solder 192, 194 is present, directly to contact 170, 172 of carrier 100. For example, as depicted, system board contact 304 is connected to pre-solder 170 by solder interconnect 320, system board contact 306 is connected to pre-solder 172 by solder interconnect 320, system board contact 308 is connected to pre-solder 172 by solder interconnect 320, system board contact 310 is connected to pre-solder 172 by solder interconnect 320, and system board contact 312 is connected to pre-solder 170 by solder interconnect 320.

System board contact 306 may be electrically connected to wiring 171 within carrier 110 by way of its contact 172, system board contact 308 may be electrically connected to wiring 173 within carrier 110 by way of its contact 172, and system board contact 310 may be electrically connected to wiring 175 within carrier 110 by way of its contact 172. Wiring lines 171, 173, 175 may be electrically connected to a wiring line 133, 135, 137 that is not connected to wiring line 131 or wiring line 139.

System board contact 304 may be electrically connected to VIA 160 within carrier 110 by way of its contact 170. Likewise, system board contact 312 may be electrically connected to VIA 160 within carrier 110 by way of its contact 172. Therefore, to supply potential to contact 126 of memory 120, system board 302 supplies potential to system contact 304. Similarly, to supply ground to contact 124 of memory 120, system board 302 supplies ground potential to system contact 312. For clarity, two VIAs 160 may exist in different planes (e.g., different places into or out of the page) with one VIA 160 connected to power contact 126 of a single memory 120 and the other VIA 160 connected to ground contact 125 of that memory 120.

Figure 30:
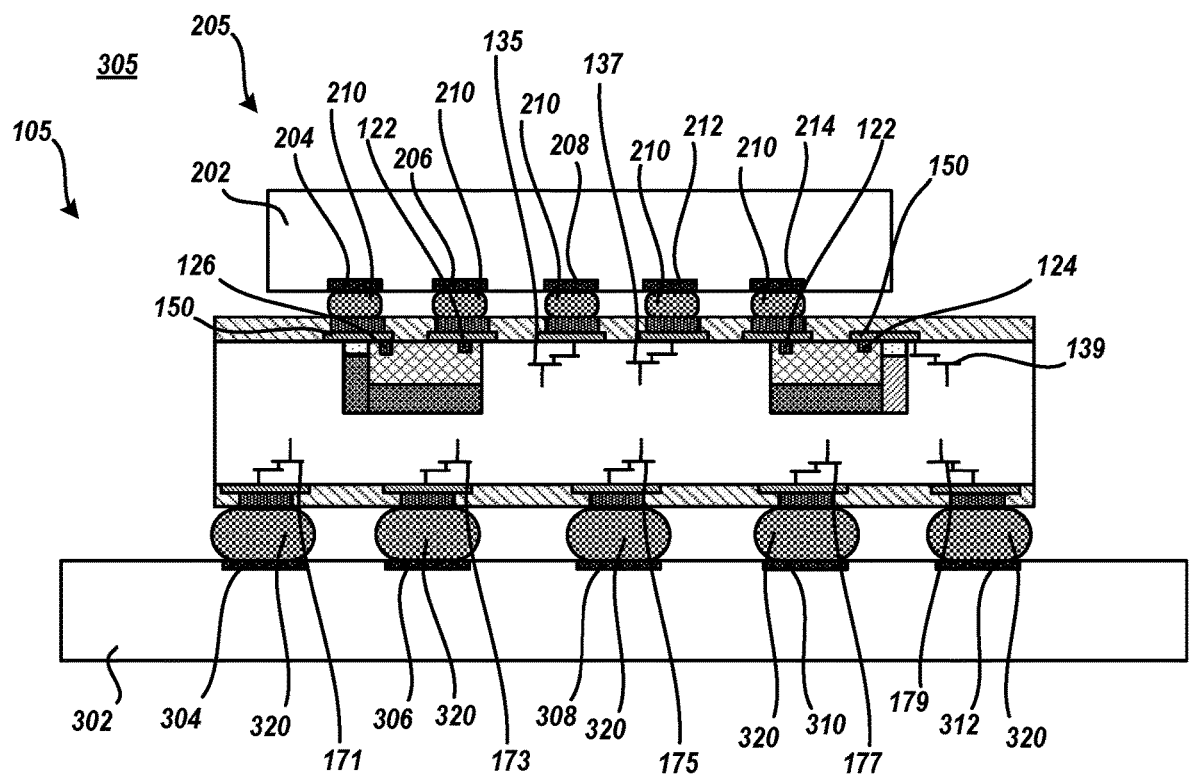
FIG. 30 depicts a cross section view of an exemplary integrated memory IC chip carrier within a higher-level IC chip package or within a higher level electronic system, in accordance with one or more embodiments of the present invention.

In some embodiments, such as depicted in FIG. 30, IC chip contacts (e.g., 204, 206 or the like) may be individually directly connected to contact 150, 152 by way of interconnects 210 and pre-solders 190 if present, or in other words, the access signal and power/ground from IC chip contact need not travel through wiring 131, 133, etc. of carrier 310. In such embodiments, the IC chip 202 supplies both access signals and power/ground potential to memory 120.

Figure 9:
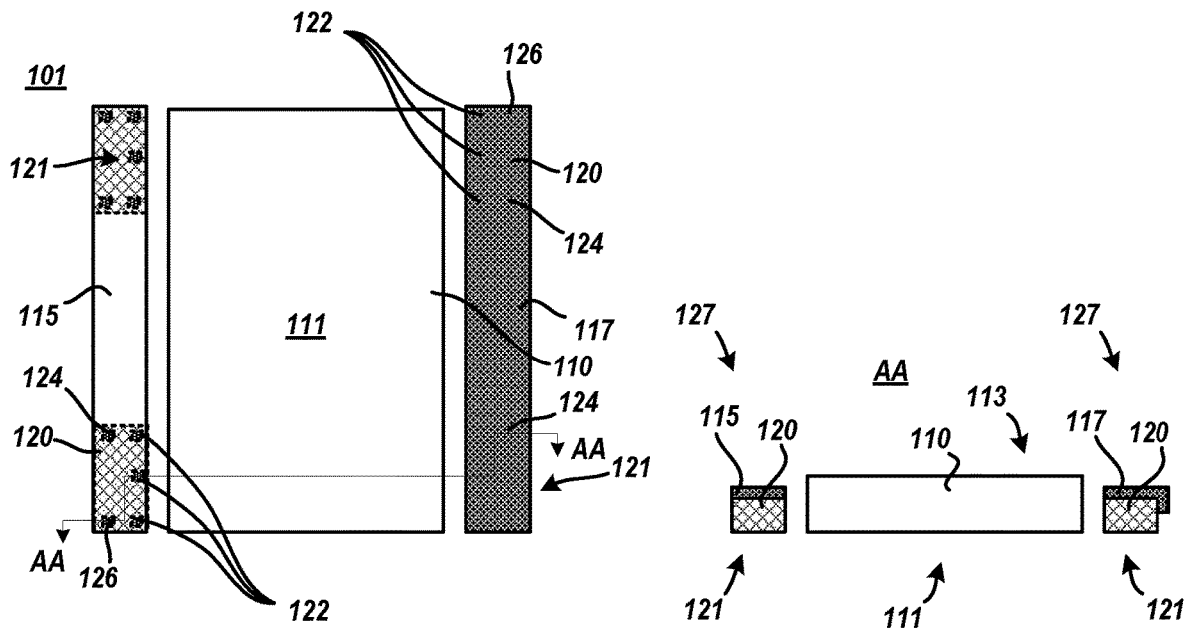
FIG. 9 depicts views of an exemplary integrated memory IC chip carrier fabrication stage, in accordance with one or more embodiments of the present invention.

FIG. 9 depicts views of an exemplary integrated memory IC chip carrier 101 at an initial fabrication stage. At the present fabrication stage carrier 101 includes carrier 110, one or more memories 120 a stiffer and heat spreader that removes heat from memory 120 and stiffens carrier 110 to reduce carrier 110 warpage. One view of FIG. 9 depicts chip surface 111 of carrier 110, respective contact surfaces 121 of different memories 120, and a plane AA through a left memory 120 to the left of carrier 110, through carrier 110, and through a right memory to the right of carrier 110. An IC chip and carrier 110 may be positioned relative thereto so that chip surface 111 faces the IC chip and that the system surface 113 faces the higher level system, such as a motherboard. Another view of FIG. 9 depicts a cross section of carrier 110, memory 120, and the stiffer and heat spreader at plane AA.

The stiffer and heat spreader (SHS) may be SHS 115 that thermally contacts a system facing surface 127 of memory 120. System facing surface 127 may face the opposite direction relative to contact surface 121. SHS 115 may be a metal or other material that has a sufficient thermal conductivity to maintain an operating temperature of memory 120 below a predetermined critical temperature that causes operational failure of memory 120. SHS 115 may be of a similar width to memory 120 such that sidewalls of SHS 115 may be coplanar with sidewalls of memory 120. Further, SHS 115 may have a front surface that is coplanar with a front surface of carrier 110 and a back surface that is coplanar with a back surface of carrier 110, as is shown in FIG. 9. In other words, SHS 115 may contact a front memory 120 and a read memory 120. In embodiments where SHS 115 is of greater dimension front to back relative to memory 120, SHS 115 stiffens the carrier 101 to reduce warpage of the carrier 101.

The SHS may be SHS 117 that include a portion that thermally contacts the system facing surface 127 of memory 120 and an orthogonal portion that thermally contacts a sidewall of memory 120. Because of the additional sidewall of SHS 117 relative to SHS 115, SHS 117 provides increased stiffening to carrier 101. In embodiments, as is shown in FIG. 9, the orthogonal portion thermally contacts a portion of the sidewall of memory 120.

Figure 10:
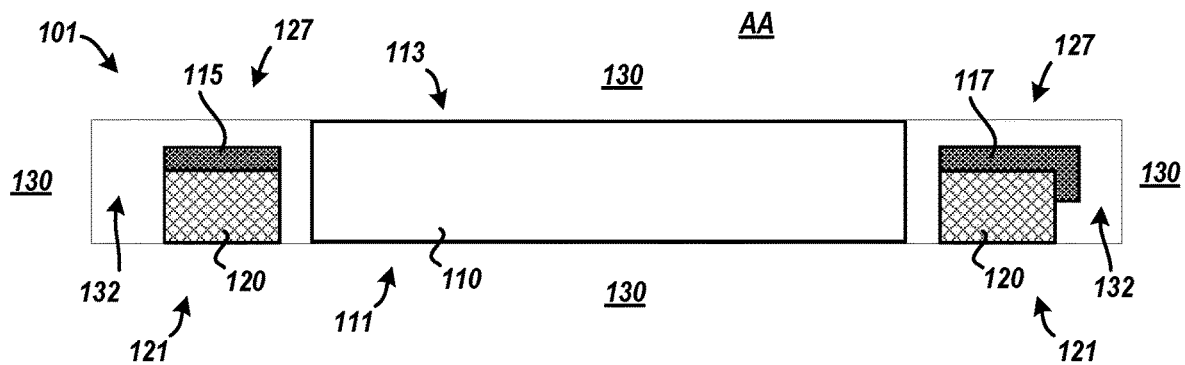
FIG. 10-FIG. 15 depict cross section view of exemplary integrated memory IC chip carrier fabrication stages, in accordance with one or more embodiments of the present invention.

FIG. 10 depicts a cross section view AA of integrated memory IC chip carrier 101 at a subsequent fabrication stage. At the present fabrication stage, carrier 110, one or more memories 120, and the SHS are positioned relative thereto within a form 130. The memory 120 and the carrier 110 may be positioned relative thereto so that contact surface 121 of memory 120 and the chip surface 111 of carrier 110 are coplanar. Similarly, the memory 120 and the carrier 110 may be positioned relative thereto so that signal contacts 122 are nearest carrier 110. The contact surface 121 of memory 120 and the chip surface 111 of carrier 110 may be placed upon a lower internal surface of form 130. Form 130 includes an internal void or voids 132 that accept injected material.

The SHS 115 may be positioned against surface 127 of memory 120 so that sidewalls of SHS 115 are coplanar with sidewalls of memory 120. If SHS 115 is associated with one memory 120, that SHS 115 may be further positioned against memory 120 so that front and rear sidewalls of SHS 115 are coplanar with front and rear sidewalls of memory 120, respectively. If SHS 115 is associated with multiple memories 120, that SHS 115 may be further positioned against those memories 120 so that front sidewall of SHS 115 is coplanar with a front sidewall of a front memory 120 and a rear sidewall of SHS 115 is coplanar with a rear sidewall of a rear memory 120.

The SHS 117 may be positioned against surface 127 of memory 120 so a sidewall of SHS 117 is coplanar with one sidewall of memory 120 and a sidewall of the orthogonal portion of SHS 117 is coplanar with the other sidewall of memory 120. If SHS 117 is associated with one memory 120, that SHS 117 may be further positioned against memory 120 so that front and rear sidewalls of SHS 117 are coplanar with front and rear sidewalls of memory 120, respectively. If SHS 117 is associated with multiple memories 120, that SHS 117 may be further positioned against those memories 120 so that a front sidewall of SHS 117 is coplanar with a front sidewall of a front memory 120 and a rear sidewall of SHS 117 is coplanar with a rear sidewall of a rear memory 120.

In some embodiments, a thermal interface material such as a gel, paste, or the like may be applied upon surface 127 of memory 120, or upon a juxtaposed location of the SHS, prior to thermally connecting the SHS to memory 120.

Figure 11:
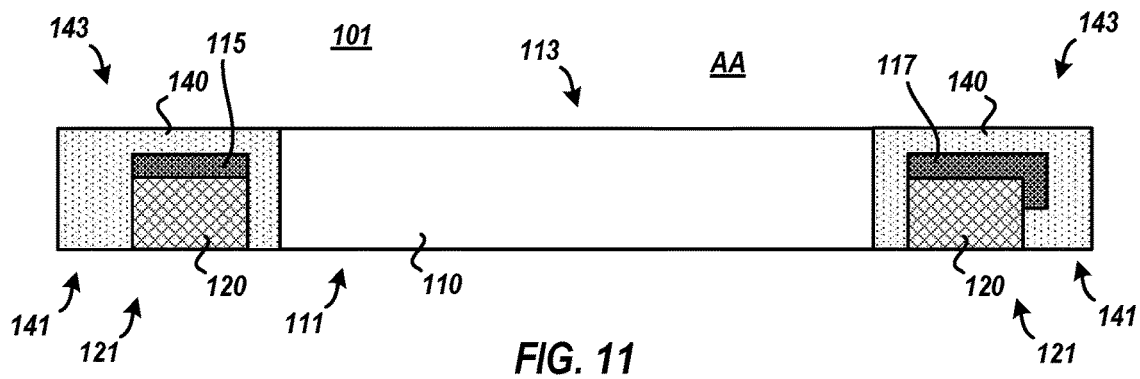

FIG. 11 depicts a cross section view AA of integrated memory IC chip carrier 101 at a subsequent fabrication stage. At the present fabrication stage, material 140 that is injected into voids 132 and mechanically connects memory 120, the SHS, and carrier 110. Material 140 may surround the perimeter of the combination of memory 120 and SHS 115, 117 on all sides but for contact surface 121 of memory 120. Likewise, material 140 may surround carrier 110 on all sides but for chip surface 111 and system surface 113 of carrier 110. Material 140 has a surface 141 that may be coplanar with contact surface 121 and/or chip surface 111. Similarly, material 140 has a surface 143 that may be coplanar with system surface 113.

Figure 12:
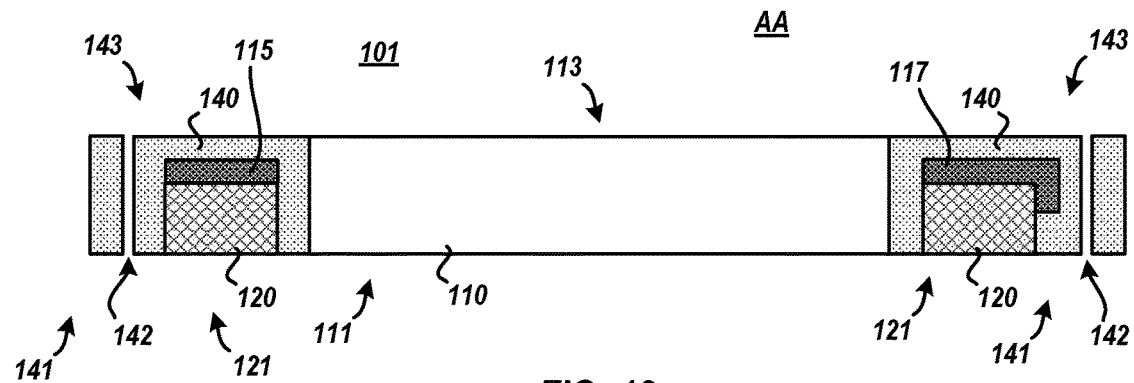

FIG. 12 depicts a cross section view AA of integrated memory IC chip carrier 101 at a subsequent fabrication stage. At the present fabrication stage, one or more VIA holes 142 are formed within material 140 to the outside of memory 120 relative to carrier 110. For example, circular holes 142 are drilled from the surface 141 to the surface 143 in the plane of power contacts 124 and ground contacts 126 in material 140.

Figure 13:
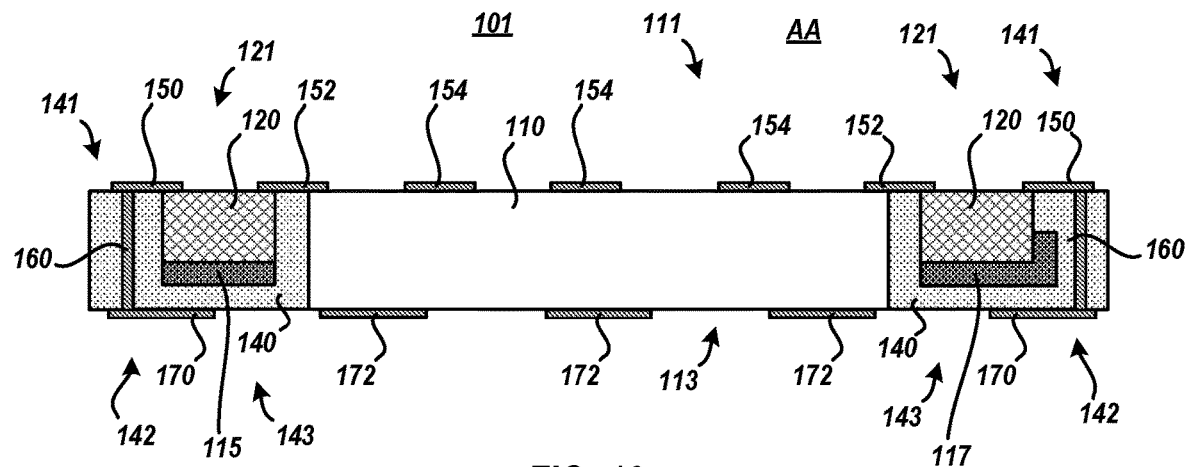

FIG. 13 depicts a cross section view AA of integrated memory IC chip carrier 101 at a subsequent fabrication stage. At the present fabrication stage interconnects are formed. The interconnects are electrically conductive pathways and may be contacts, pads, vias, or the like.

Interconnects may be formed upon the chip facing surfaces of material 140, memory 120, and carrier 110. For example, contacts 154 may be formed upon chip surface 111. Likewise, contacts 152 may be formed upon chip surface 111, upon surface 141, upon surface 121, and upon signal contact 122 of memory 120. Similarly, VIAs 160 may be formed within holes 142. Likewise, contacts 150 may be formed upon surface 141, upon a respective VIA 160, upon surface 121, and upon power contact 126 or ground contact 124 of memory 120.

Interconnects may also be formed upon system facing surfaces of material 140 and carrier 110. For example, contacts 172 may be formed upon system surface 113. Likewise, contacts 170 may be formed upon surface 143 and upon a respective VIA 160. As such, one contact 170 is interconnected with one contact 150 by one VIA 160.

Such interconnects may be formed by known fabrication techniques. For example, a dielectric layer may be formed upon the IC chip facings surface of carrier 101 and upon the system facing surfaces of carrier 101. The dialectic layers may be patterned, or in other words, openings may be formed therein where the interconnects are to be formed. The interconnects may be formed within the openings via sputtering, plating, or other known deposition techniques. The dielectric layers are removed leaving the formed interconnects upon the IC chip facings surface of carrier 101 and formed upon the system facing surfaces of carrier 101. The formation of the various interconnects may be completed in stages. For example, VIAs 160 may be formed prior to contacts 150, 152, 154, 170, and/or 172. Likewise, contacts 154, 172 may be formed prior to or after contacts 150, 152, 170. Though a finite number of interconnects are depicted, carrier 101 may include a greater number of interconnects than the number depicted. When viewing carrier 110 normal to surface 111, the shape of contacts 150, 152, 154 may be polygonal (i.e., square, rectangular, or the like). Similarly, when viewing carrier 110 normal to surface 113, the shape of contacts 170, 172, may also be polygonal. In some embodiments, contacts 152, 154, and 172 may be connected to circuit wiring lines within carrier 110.

Figure 14:
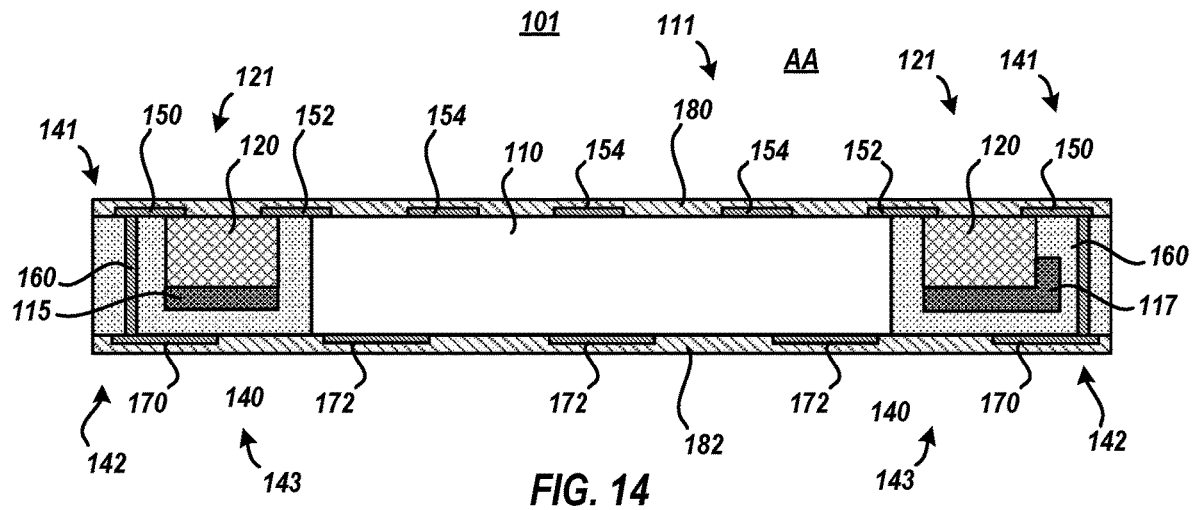

FIG. 14 depicts a cross section view AA of integrated memory IC chip carrier 101 at a subsequent fabrication stage. At the present fabrication stage, a solder mask 180 is formed upon chip facing surfaces of material 140, memory 120, and carrier 110 and is formed surrounding contacts 150, 152, and 154. In other words, solder mask 180 may blanket cover the features of carrier 101 on the side of carrier 101 that faces the IC chip. At the present fabrication stage, a solder mask 182 is formed upon system facing surfaces of material 140 and carrier 110 and is formed surrounding contacts 170 and 172. In other words, solder mask 182 may blanket cover the features of carrier 101 on the side of carrier 101 that faces the system.

Figure 15:
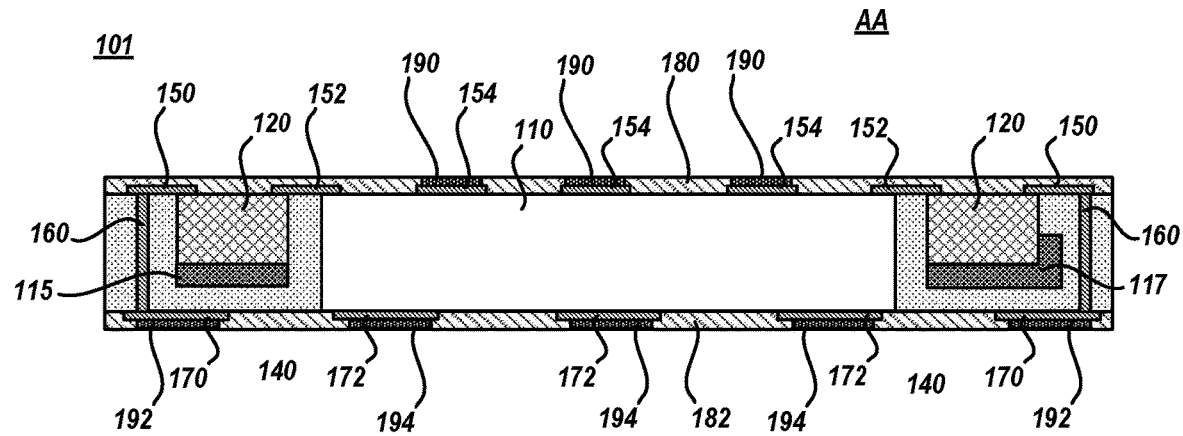

FIG. 15 depicts a cross section view AA of integrated memory IC chip carrier 101 at a subsequent fabrication stage. At the present fabrication stage, solder masks 180, 182 are opened in line with contacts 154, 170, and 172 and pre-solder material is formed within the openings. For example, openings within solder mask 180 are formed above contacts 154 and openings within solder mask 182 are formed below contacts 170 and 172. Subsequently, pre-solder material 190 is formed within the openings in line with contacts 154, pre-solder material 192 is formed within the openings in line with contacts 170, and pre-solder material 194 is formed within the openings inline with contacts 172. For clarity, the fabrication stages depicted in FIG. 14 and FIG. 15 may be optional in implementations of carrier 101 that connect to the IC chip or system by non-solder type interconnects, such as fuzzy buttons, posts, grid, or the like.

Figure 16:
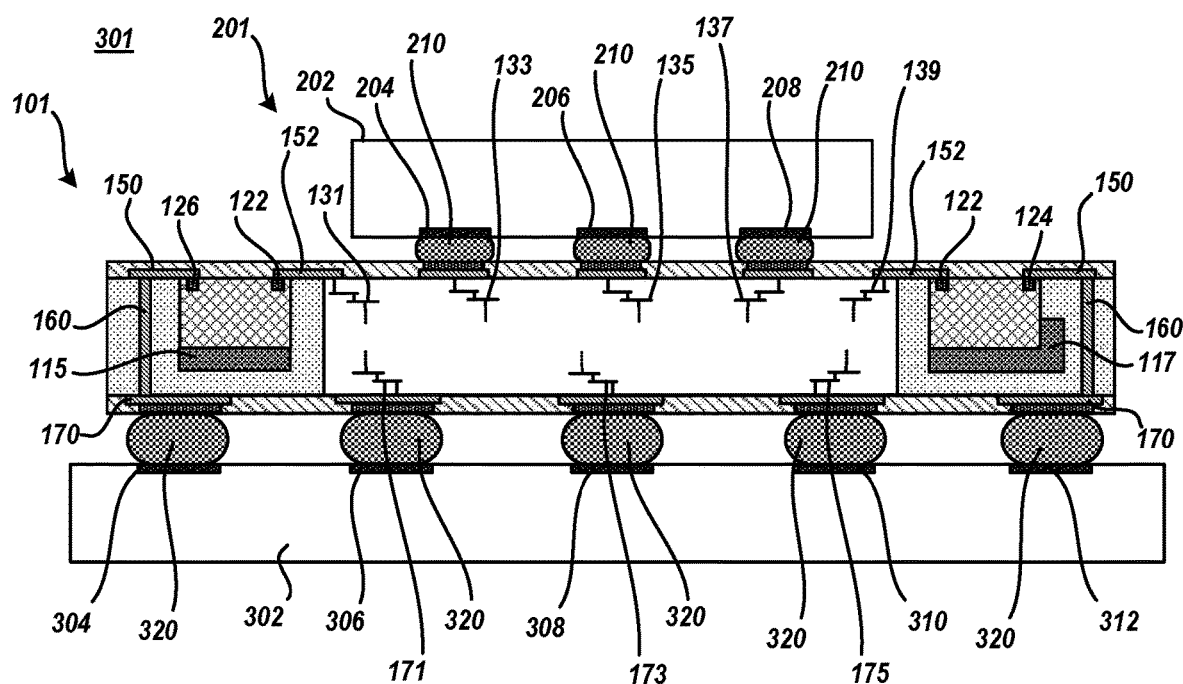
FIG. 16 depicts a cross section view of an exemplary integrated memory IC chip carrier within a higher-level IC chip package or within a higher level electronic system, in accordance with one or more embodiments of the present invention.

FIG. 16 depicts a cross section view of integrated memory IC chip carrier 101 within IC chip package 201 or within a system 301. IC chip package 201 includes carrier 101 connected to IC chip 202. System 301 includes IC chip package 201 connected to a system board 302.

IC chip 202 may be connected to carrier 101 by interconnects 210, such as solder, C4 solder, buttons, posts, or the like that connect a contact of the IC chip 202 to pre-solder 190 or, if no pre-solder 190 is present, directly to contact 154 of carrier 101. For example, as depicted, IC chip contact 204 is connected to pre-solder 190 by C4 solder interconnect 210, IC chip contact 206 is connected to pre-solder 190 by C4 solder interconnect 210, and IC chip contact 208 is connected to pre-solder 190 by C4 solder interconnect 210.

IC chip contact 204 may be electrically connected to wiring 133 within carrier 110 by way of its contact 154, IC chip contact 206 is electrically connected to wiring 135 within carrier 110 by way of its contact 154, and IC chip contact 208 is electrically connected to wiring 137 within carrier 110 by way of its contact 154. Wiring 131 may be electrically connected with contact 152 that is connected to one memory 120. Similarly, wiring 139 is electrically connected with contact 152 that is connected to another memory 120. At least one of the wiring lines 133, 135, and/or 137 may be connected to wiring line 131. Similarly, at least one of the wiring lines 133, 135, and/or 137 may be electrically connected to wiring line 139. Therefore, to access the left memory 120, IC chip 202 may send an access instruction or signal from the appropriate contact 204, 206, 208 to contact 122 by way of wiring line 131 and to access the right memory 120, IC chip 202 may send an access instruction or signal from the appropriate contact 204, 206, 208 to contact 122 by way of wiring line 139.

IC chip package 201 may be connected to system board 302 by interconnects 320, such as solder, solder, buttons, posts, or the like that connect a contact of the system board 302 to pre-solder 192, 194 or, if no pre-solder 192, 194 is present, directly to contact 170, 172 of carrier 101. For example, as depicted, system board contact 304 is connected to pre-solder 170 by solder interconnect 320, system board contact 306 is connected to pre-solder 172 by solder interconnect 320, system board contact 308 is connected to pre-solder 172 by solder interconnect 320, system board contact 310 is connected to pre-solder 172 by solder interconnect 320, and system board contact 312 is connected to pre-solder 170 by solder interconnect 320.

System board contact 306 may be electrically connected to wiring 171 within carrier 110 by way of its contact 172, system board contact 308 may be electrically connected to wiring 173 within carrier 110 by way of its contact 172, and system board contact 310 may be electrically connected to wiring 175 within carrier 110 by way of its contact 172. Wiring lines 171, 173, 175 may be electrically connected to a wiring line 133, 135, 137 that is not connected to wiring line 131 or wiring line 139.

System board contact 304 may be electrically connected to VIA 160 within carrier 110 by way of its contact 170. Likewise, system board contact 312 may be electrically connected to VIA 160 within carrier 110 by way of its contact 172. Therefore, to supply potential to contact 126 of memory 120, system board 302 supplies potential to system contact 304. Similarly, to supply ground to contact 124 of memory 120, system board 302 supplies ground potential to system contact 312. For clarity, two VIAs 160 may exist in different planes (e.g., different places into or out of the page) with one VIA 160 connected to power contact 126 of a single memory 120 and the other VIA 160 connected to ground contact 125 of that memory 120.

In some embodiments, such as depicted in FIG. 30, IC chip contacts (e.g., 204, 206 or the like) may be individually directly connected to contact 150, 152 by way of interconnects 210 and pre-solders 190 if present, or in other words, the access signal and power/ground from IC chip contact need not travel through wiring 131, 133, etc. of carrier 310. In such embodiments, the IC chip 202 supplies both access signals and power/ground potential to memory 120.

Figure 17:
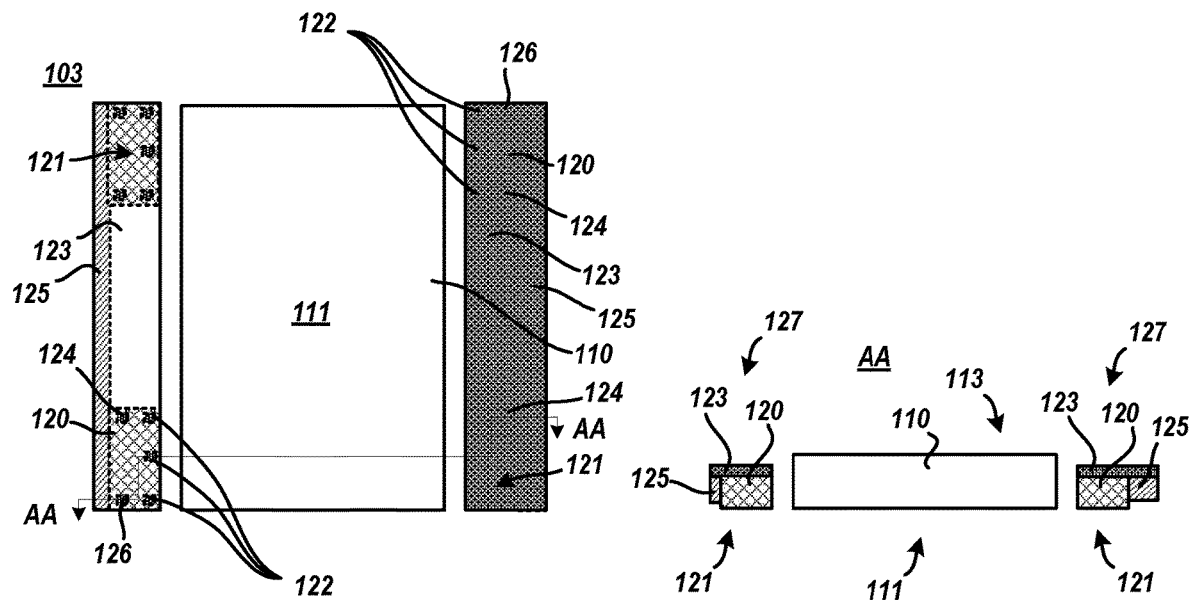
FIG. 17 depicts views of an exemplary integrated memory IC chip carrier fabrication stage, in accordance with one or more embodiments of the present invention.

FIG. 17 depicts views of an exemplary integrated memory IC chip carrier 103 at an initial fabrication stage. At the present fabrication stage carrier 103 includes carrier 110, one or more memories 120 a multi material stiffer and heat spreader that removes heat from memory 120 and stiffens carrier 110 to reduce carrier 110 warpage. One view of FIG. 17 depicts chip surface 111 of carrier 110, respective contact surfaces 121 of different memories 120, and a plane AA through a left memory 120 to the left of carrier 110, through carrier 110, and through a right memory to the right of carrier 110. An IC chip and carrier 110 may be positioned relative thereto so that chip surface 111 faces the IC chip and that the system surface 113 faces the higher level system, such as a motherboard. Another view of FIG. 17 depicts a cross section of carrier 110, memory 120, and the multi material stiffer and heat spreader at plane AA.

The multi material stiffer and heat spreader (MMSHS) includes SHS 123 that consists of a first material and a SHS 125 that consists of a different material relative to SHS 123. The different materials may allow for increasing the thermal conductivity of one material relative to the other material, may allow for CTE matching of one of the materials versus the carrier 110, or the like. SHS 123 and SHS 125 may be joined prior to the MMSHS being contacted with one or more memories 120. The MMSHS thermally contacts at least the system facing surface 127 of memory 120.

SHS 123 and/or SHS 125 may be a metal or other material that has a sufficient thermal conductivity to maintain an operating temperature of memory 120 below a predetermined critical temperature that causes operational failure of memory 120. The SHS 123 may be a portion of the MMSHS that thermally contacts the system facing surface 127 of memory 120 and the SHS 125 of the MMSHS may be an orthogonal portion that thermally contacts a sidewall of memory 120. The width of SHS 125 may be relative thin as is shown in association with the left memory 120 depicted so that a VIA 160 may be formed within material 141 outside of SHS 125 or may be relatively wide as is shown in association with the right memory 120 depicted so that a VIA 160 may be formed through at least SHS 125.

Figure 18:
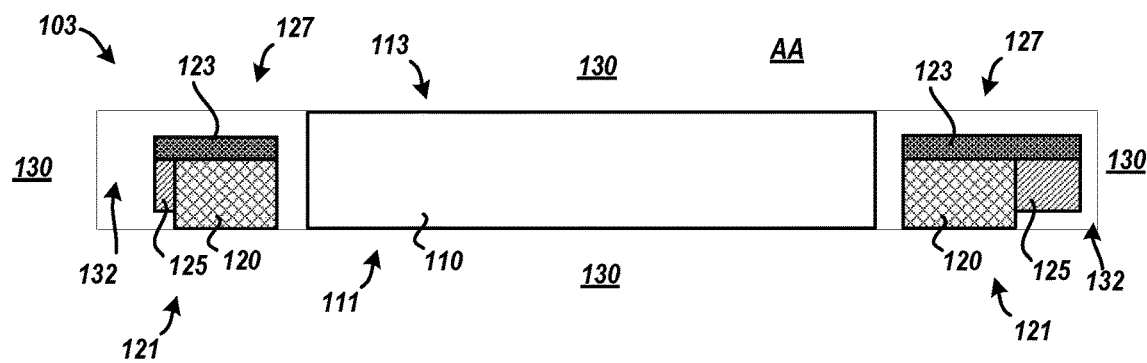
FIG. 18-FIG. 24 depict cross section view of exemplary integrated memory IC chip carrier fabrication stages, in accordance with one or more embodiments of the present invention.

FIG. 18 depicts a cross section view AA of integrated memory IC chip carrier 103 at a subsequent fabrication stage. At the present fabrication stage, carrier 110, one or more memories 120, and one or more MMSHSs are positioned relative thereto within form 130. The memory 120 and the carrier 110 may be positioned relative thereto so that contact surface 121 of memory 120 and the chip surface 111 of carrier 110 are coplanar. Similarly, the memory 120 and the carrier 110 may be positioned relative thereto so that signal contacts 122 are nearest carrier 110. The contact surface 121 of memory 120 and the chip surface 111 of carrier 110 may be placed upon a lower internal surface of form 130. Form 130 includes an internal void or voids 132 that accept injected material.

The MMSHS may be positioned against memory 120 so that a sidewall of SHS 123 is coplanar with a sidewall of memory 120 and so that a sidewall of SHS 125 is juxtaposed against an opposite sidewall of memory 120. If the MMSHS is associated with one memory 120, that MMSHS may be further positioned against memory 120 so that front and rear sidewalls of 123, 125 are coplanar with front and rear sidewalls of memory 120, respectively. If the MMSHS is associated with multiple memories 120, that MMSHS may be further positioned against those memories 120 so that a front sidewall of SHS 123, 125 is coplanar with a front sidewall of a front memory 120 and a rear sidewall of SHS 123, 125 is coplanar with a rear sidewall of a rear memory 120.

In some embodiments, a thermal interface material such as a gel, paste, or the like may be applied upon surface 127 and one or more sidewalls of memory 120, or upon a juxtaposed location of the MMSHS, prior to thermally connecting the MMSHS to memory 120.

In one implementation, which is further described below, the width of SHS 125 is relative thin to allow for a VIA 160 to formed within material 140 between SHS 125 and a left perimeter of carrier 100 and in another implementation, which is further described below, the width of SHS 123, 125 is relatively larger to allow for a VIA 160 to be formed there within.

Figure 19:
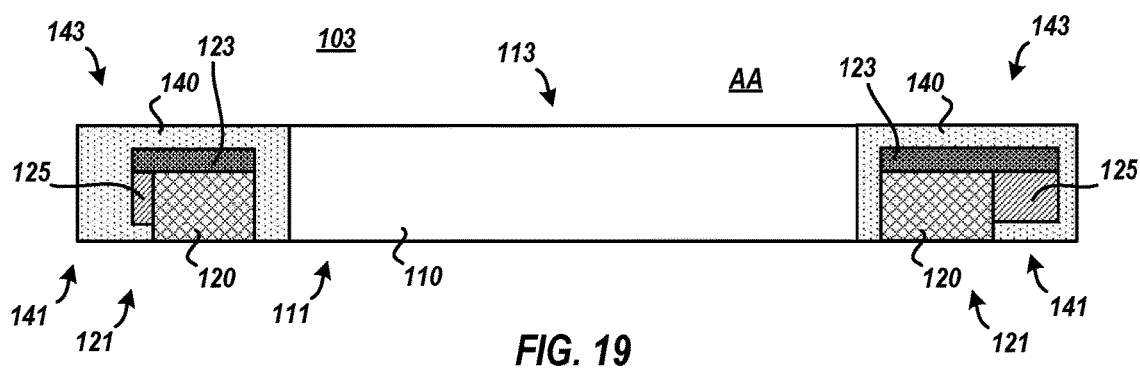

FIG. 19 depicts a cross section view AA of integrated memory IC chip carrier 103 at a subsequent fabrication stage. At the present fabrication stage, material 140 is injected into voids 132 and mechanically connects memory 120, the MMHS, and carrier 110. Material 140 may surround the perimeter of the combination of memory 120 and SHS 123, 125 on all sides but for contact surface 121 of memory 120. Likewise, material 140 may surround carrier 110 on all sides but for chip surface 111 and system surface 113 of carrier 110. Material 140 has a surface 141 that may be coplanar with contact surface 121 and/or chip surface 111. Similarly, material 140 has a surface 143 that may be coplanar with system surface 113.

Figure 20:
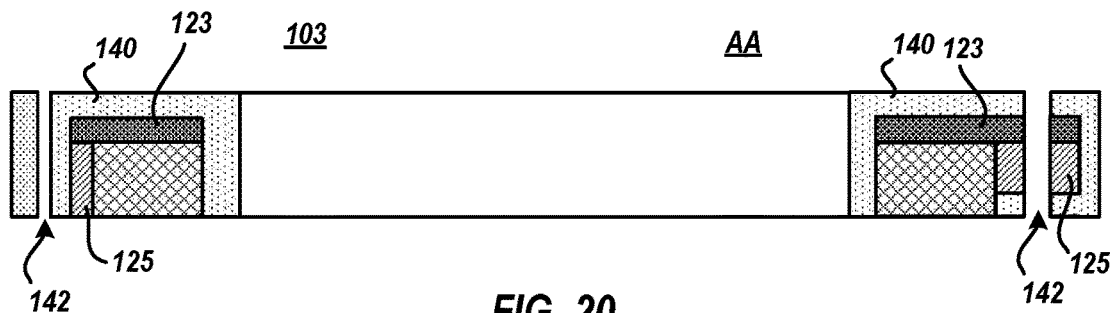

FIG. 20 depicts a cross section view AA of integrated memory IC chip carrier 103 at a subsequent fabrication stage. At the present fabrication stage, one or more VIA holes 142 may formed within material 140 to the outside of memory 120 relative to carrier 110. For example, circular holes 142 are drilled from the surface 141 to the surface 143 in the plane of power contacts 124 and ground contacts 126 in material 140. Alternatively, or in addition to, at the present fabrication stage, one or more VIA holes 142 may formed within material 140 and within MMHS to the outside of memory 120 relative to carrier 110. For example, circular holes 142 are drilled in material 140, in SHS 123, and SHS 125 from the surface 141 to the surface 143 in the plane of power contacts 124 and ground contacts 126.

Figure 21:
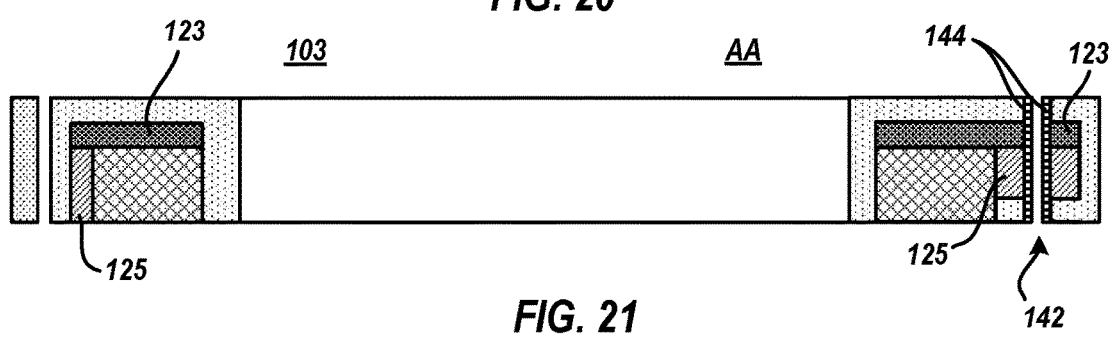

FIG. 21 depicts a cross section view AA of integrated memory IC chip carrier 103 at a subsequent fabrication stage. At the present fabrication stage, a liner 144 may be formed on the sidewall(s) of hole 142. Liner 144 is a dielectric material and may be formed by known fabrication techniques such as depositing dielectric material within hole 142. In some implementations, the entire hole 142 may be filled with the formed dielectric material and a relatively smaller diameter hole 142 may be drilled within the dielectric material to reform hole 142.

Figure 22:
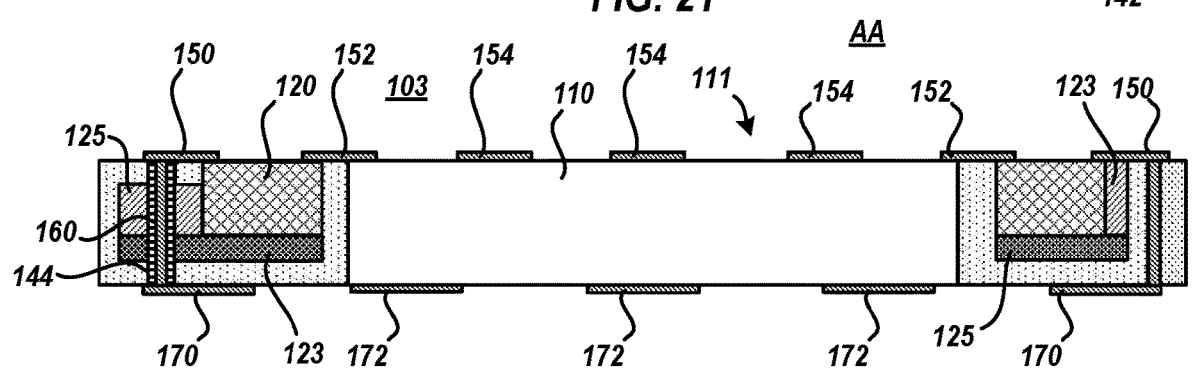

FIG. 22 depicts a cross section view AA of integrated memory IC chip carrier 103 at a subsequent fabrication stage. At the present fabrication stage, interconnects are formed. The interconnects are electrically conductive pathways and may be contacts, pads, vias, or the like.

Interconnects may be formed upon the chip facing surfaces of material 140, memory 120, and carrier 110. For example, contacts 154 may be formed upon chip surface 111. Likewise, contacts 152 may be formed upon chip surface 111, upon surface 141, upon surface 121, and upon signal contact 122 of memory 120. Similarly, VIAs 160 may be formed within holes 142. Likewise, contacts 150 may be formed upon surface 141, upon liner 144, upon a respective VIA 160, upon surface 121, and upon power contact 126 or ground contact 124 of memory 120.

Interconnects may also be formed upon system facing surfaces of material 140 and carrier 110. For example, contacts 172 may be formed upon system surface 113. Likewise, contacts 170 may be formed upon surface 143, upon liner 144, and upon a respective VIA 160. As such, one contact 170 is interconnected with one contact 150 by one VIA 160.

Such interconnects may be formed by known fabrication techniques. For example, a dielectric layer may be formed upon the IC chip facings surface of carrier 103 and upon the system facing surfaces of carrier 103. The dialectic layers may be patterned, or in other words, openings may be formed therein where the interconnects are to be formed. The interconnects may be formed within the openings via sputtering, plating, or other known deposition techniques. The dielectric layers are removed leaving the formed interconnects upon the IC chip facings surface of carrier 103 and formed upon the system facing surfaces of carrier 103. The formation of the various interconnects may be completed in stages. For example, VIAs 160 may be formed prior to contacts 150, 152, 154, 170, and/or 172. Likewise, contacts 154, 172 may be formed prior to or after contacts 150, 152, 170. Though a finite number of interconnects are depicted, carrier 103 may include a greater number of interconnects than the number depicted. When viewing carrier 110 normal to surface 111, the shape of contacts 150, 152, 154 may be polygonal (i.e., square, rectangular, or the like). Similarly, when viewing carrier 110 normal to surface 113, the shape of contacts 170, 172, may also be polygonal. In some embodiments, contacts 152, 154, and 172 may be connected to circuit wiring lines within carrier 110.

Figure 23:
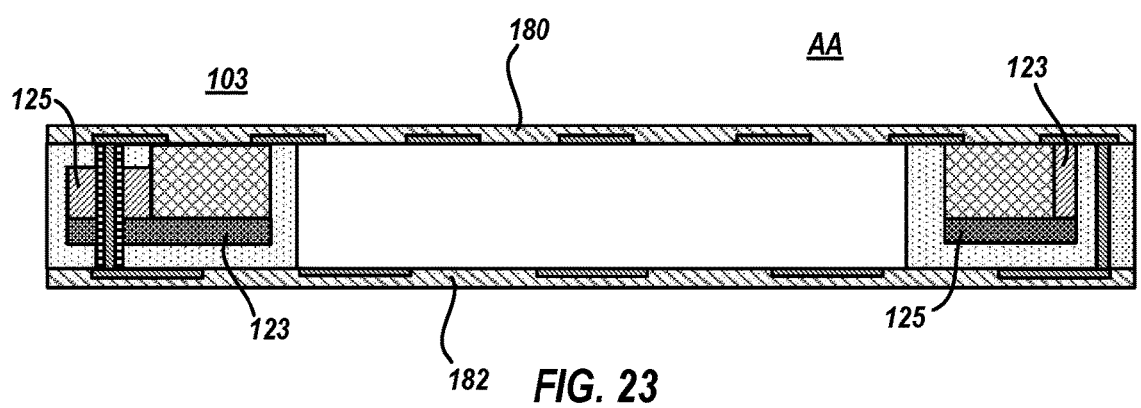

FIG. 23 depicts a cross section view AA of integrated memory IC chip carrier 103 at a subsequent fabrication stage. At the present fabrication stage, a solder mask 180 is formed upon chip facing surfaces of material 140, memory 120, and carrier 110 and is formed surrounding contacts 150, 152, and 154. In other words, solder mask 180 may blanket cover the features of carrier 103 on the side of carrier 103 that faces the IC chip. At the present fabrication stage, a solder mask 182 is formed upon system facing surfaces of material 140 and carrier 110 and is formed surrounding contacts 170 and 172. In other words, solder mask 182 may blanket cover the features of carrier 103 on the side of carrier 103 that faces the system.

Figure 24:
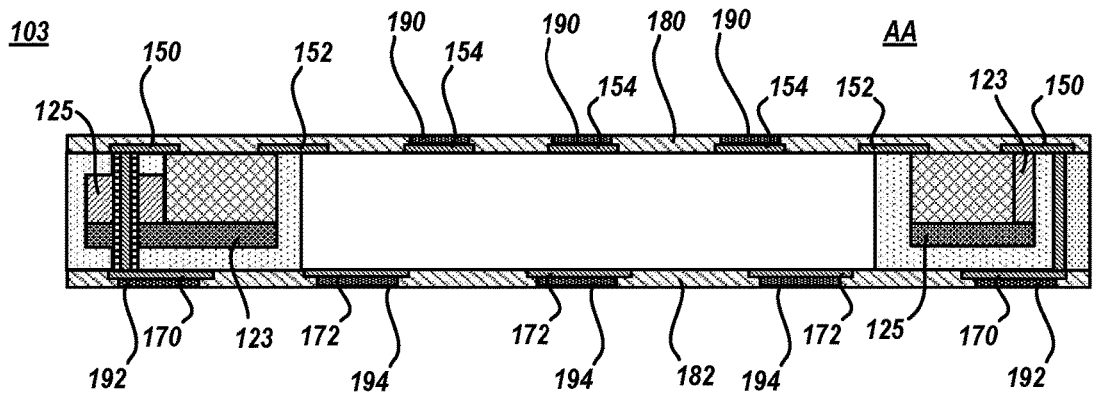

FIG. 24 depicts a cross section view AA of integrated memory IC chip carrier 103 at a subsequent fabrication stage. At the present fabrication stage, solder masks 180, 182 are opened in line with contacts 154, 170, and 172 and pre-solder material is formed within the openings. For example, openings within solder mask 180 are formed above contacts 154 and openings within solder mask 182 are formed below contacts 170 and 172. Subsequently, pre-solder material 190 is formed within the openings in line with contacts 154, pre-solder material 192 is formed within the openings in line with contacts 170, and pre-solder material 194 is formed within the openings inline with contacts 172. For clarity, the fabrication stages depicted in FIG. 23 and FIG. 24 may be optional in implementations of carrier 103 that connect to the IC chip or system by non-solder type interconnects, such as fuzzy buttons, posts, grid, or the like.

Figure 25:
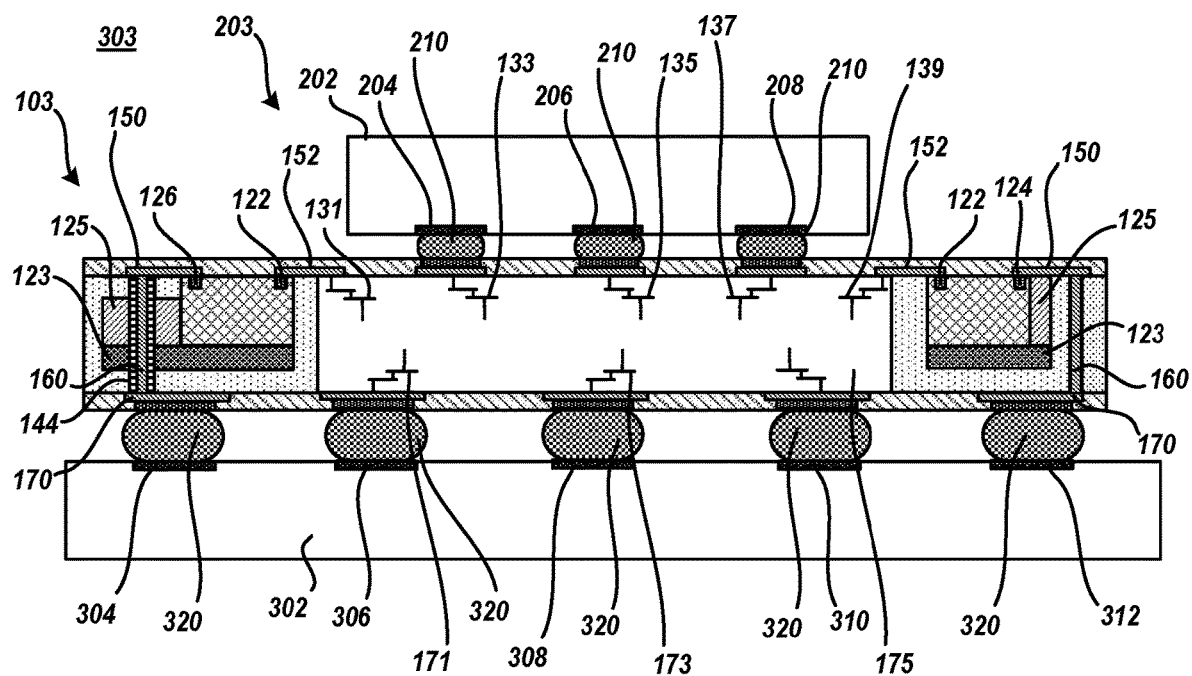
FIG. 25 depicts a cross section view of an exemplary integrated memory IC chip carrier within a higher-level IC chip package or within a higher level electronic system, in accordance with one or more embodiments of the present invention.

FIG. 25 depicts a cross section view of integrated memory IC chip carrier 103 within IC chip package 203 or within a system 303. IC chip package 203 includes carrier 103 connected to IC chip 202. System 300 includes IC chip package 203 connected to a system board 302.

IC chip 202 may be connected to carrier 103 by interconnects 210, such as solder, C4 solder, buttons, posts, or the like that connect a contact of the IC chip 202 to pre-solder 190 or, if no pre-solder 190 is present, directly to contact 154 of carrier 103. For example, as depicted, IC chip contact 204 is connected to pre-solder 190 by C4 solder interconnect 210, IC chip contact 206 is connected to pre-solder 190 by C4 solder interconnect 210, and IC chip contact 208 is connected to pre-solder 190 by C4 solder interconnect 210.

IC chip contact 204 may be electrically connected to wiring 133 within carrier 110 by way of its contact 154, IC chip contact 206 is electrically connected to wiring 135 within carrier 110 by way of its contact 154, and IC chip contact 208 is electrically connected to wiring 137 within carrier 110 by way of its contact 154. Wiring 131 may be electrically connected with contact 152 that is connected to one memory 120. Similarly, wiring 139 is electrically connected with contact 152 that is connected to another memory 120. At least one of the wiring lines 133, 135, and/or 137 may be connected to wiring line 131. Similarly, at least one of the wiring lines 133, 135, and/or 137 may be electrically connected to wiring line 139. Therefore, to access the left memory 120, IC chip 202 may send an access instruction or signal from the appropriate contact 204, 206, 208 to contact 122 by way of wiring line 131 and to access the right memory 120, IC chip 202 may send an access instruction or signal from the appropriate contact 204, 206, 208 to contact 122 by way of wiring line 139.

IC chip package 203 may be connected to system board 302 by interconnects 320, such as solder, solder, buttons, posts, or the like that connect a contact of the system board 302 to pre-solder 192, 194 or, if no pre-solder 192, 194 is present, directly to contact 170, 172 of carrier 103. For example, as depicted, system board contact 304 is connected to pre-solder 170 by solder interconnect 320, system board contact 306 is connected to pre-solder 172 by solder interconnect 320, system board contact 308 is connected to pre-solder 172 by solder interconnect 320, system board contact 310 is connected to pre-solder 172 by solder interconnect 320, and system board contact 312 is connected to pre-solder 170 by solder interconnect 320.

System board contact 306 may be electrically connected to wiring 171 within carrier 110 by way of its contact 172, system board contact 308 may be electrically connected to wiring 173 within carrier 110 by way of its contact 172, and system board contact 310 may be electrically connected to wiring 175 within carrier 110 by way of its contact 172. Wiring lines 171, 173, 175 may be electrically connected to a wiring line 133, 135, 137 that is not connected to wiring line 131 or wiring line 139.

System board contact 304 may be electrically connected to VIA 160 within carrier 110 by way of its contact 170. Likewise, system board contact 312 may be electrically connected to VIA 160 within carrier 110 by way of its contact 172. Therefore, to supply potential to contact 126 of memory 120, system board 302 supplies potential to system contact 304. Similarly, to supply ground to contact 124 of memory 120, system board 302 supplies ground potential to system contact 312. For clarity, two VIAs 160 may exist in different planes (e.g., different places into or out of the page) with one VIA 160 connected to power contact 126 of a single memory 120 and the other VIA 160 connected to ground contact 125 of that memory 120.

In some embodiments, such as depicted in FIG. 30, IC chip contacts (e.g., 204, 206 or the like) may be individually directly connected to contact 150, 152 by way of interconnects 210 and pre-solders 190 if present, or in other words, the access signal and power/ground from IC chip contact need not travel through wiring 131, 133, etc. of carrier 310. In such embodiments, the IC chip 202 supplies both access signals and power/ground potential to memory 120.

Figure 26:
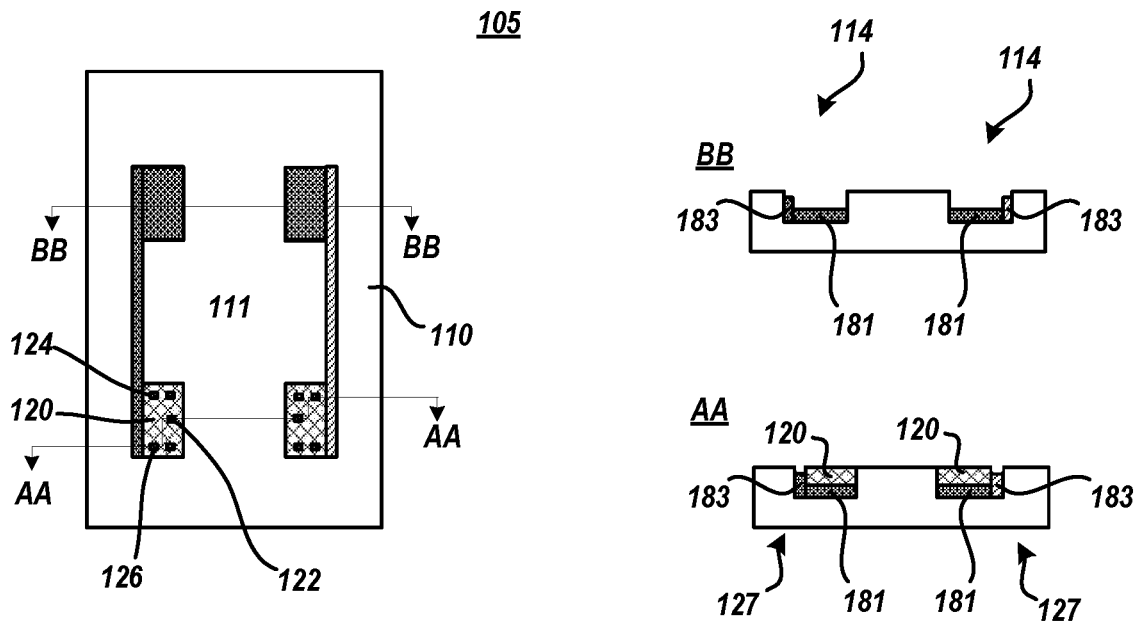
FIG. 26 depicts views of an exemplary integrated memory IC chip carrier fabrication stage, in accordance with one or more embodiments of the present invention.

FIG. 26 depicts views of an exemplary integrated memory IC chip carrier 105 at an initial fabrication stage. At the present fabrication stage carrier 105 includes carrier 110, one or more memories 120 a stiffer and heat spreader that removes heat from memory 120 and stiffens carrier 110 to reduce carrier 110 warpage. One view of FIG. 26 depicts chip surface 111 of carrier 110, respective contact surfaces 121 of different memories 120, a plane AA through a front left memory 120 to the left of carrier 110, through carrier 110, and through a right front memory to the right of carrier 110, and a plane BB through a rear left memory 120 to the left of carrier 110, through carrier 110, and through a right rear memory to the right of carrier 110. An IC chip and carrier 110 may be positioned relative thereto so that chip surface 111 faces the IC chip and that the system surface 113 faces the higher-level system, such as a motherboard. Another view of FIG. 26 depicts a cross section of carrier 110, memory 120, and the stiffer and heat spreader at plane AA. Yet another view of FIG. 26 depicts a cross section of carrier 110, memory 120, and the stiffer and heat spreader at plane BB.

Carrier 110 may include a cutout, notch, recess, or the like, herein denoted as recess 114 that extends inwards into carrier 110 from chip surface 111. The recess 114 may have a section that is configured to accept or juxtapose with SHS 181 and/or memory 120 and may have a section that is configured to accept or juxtapose with SHS 183. Recess 114 may be formed to a depth so that the contact surface 121 of memory 120 is coplanar with IC chip surface 111. If SHS 181, 183 are not included in carrier 105, recess 114 may be formed to a width such that sidewalls of memory 120 are juxtaposed with sidewalls of the recess 114. If SHS 183 is included, recess 114 may be formed to a width such that a side wall of memory 120 is juxtaposed with a sidewall of recess 114 and a sidewall of SHS 183 is juxtaposed with a sidewall of recess 114.

The SHS includes SHS 181 and a SHS 183. The materials of SHS 181, 183 may be the same as shown in association with the left memory 120 or they may be different as shown in association with the right memory 120. The different materials may allow for increasing the thermal conductivity of one material relative to the other material, may allow for CTE matching of one of the materials versus the carrier 110, or the like. SHS 181 and SHS 183 may be joined prior to the SHS being contacted with one or more memories 120. The SHS thermally contacts at least the system facing surface 127 of memory 120 and may further thermally contact a sidewall of memory 120. SHS 181 may be configured to locally juxtapose with surface 127 of memory 120 within recess 114 to remove heat from memory 120 and transfer that heat into carrier 110. SHS 183 may be configured to juxtapose with a sidewall of one or more memories 127 within recess 114 to remove heat from memory 120 and transfer that heat into carrier 110 and to stiffen carrier 110 to reduce carrier 110 warpage. For clarity, SHS 181 may be optional and/or SHS 183 may be optional within carrier 105.

SHS 181 and/or SHS 183 may be a metal or other material that has a sufficient thermal conductivity to maintain an operating temperature of memory 120 below a predetermined critical temperature that causes operational failure of memory 120. The SHS 181 may be a portion of the SHS that thermally contacts the system facing surface 127 of memory 120 and the SHS 183 of the SHS may be an orthogonal portion that thermally contacts a sidewall of memory 120. As in other embodiments, a thermal interface material may be applied between the SHS 181, 183 and the memory 120.

Figure 27:
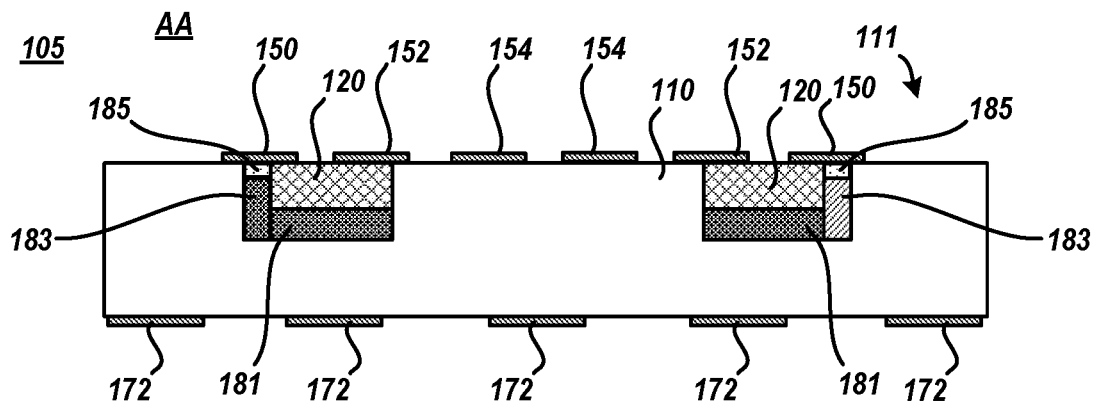
FIG. 27-FIG. 29 depict cross section view of exemplary integrated memory IC chip carrier fabrication stages, in accordance with one or more embodiments of the present invention.

FIG. 27 depicts a cross section view AA of integrated memory IC chip carrier 105 at a subsequent fabrication stage. At the present fabrication stage, interconnects are formed. The interconnects are electrically conductive pathways and may be contacts, pads, vias, or the like.

In embodiments where SHS 183 is included in carrier 105, a surface of SHS 183 may be recessed from IC chip facing surface 111 of carrier 110 and dielectric material 185 may be formed therein and electrically separate SHS 183 from a contact that may be formed thereupon. A surface of material 185 may be coplanar with the contact surface 121 and with IC chip facing surface 111.

Interconnects may be formed upon the chip facing surfaces of material 185, memory 120, and carrier 110. For example, contacts 154 may be formed upon chip surface 111. Likewise, contacts 152 may be formed upon chip surface 111, upon surface 121, and upon signal contact 122 of memory 120. Likewise, contacts 150 may be formed upon 185, upon surface 121, and upon power contact 126 or ground contact 124 of memory 120. Interconnects may also be formed upon system facing surfaces of material 140 and carrier 110. For example, contacts 172 may be formed upon system surface 113.

Such interconnects may be formed by known fabrication techniques. For example, a dielectric layer may be formed upon the IC chip facings surface of carrier 105 and upon the system facing surfaces of carrier 105. The dialectic layers may be patterned, or in other words, openings may be formed therein where the interconnects are to be formed. The interconnects may be formed within the openings via sputtering, plating, or other known deposition techniques. The dielectric layers are removed leaving the formed interconnects upon the IC chip facings surface of carrier 105 and formed upon the system facing surfaces of carrier 105. The formation of the various interconnects may be completed in stages. For example, contacts 154, 172 may be formed prior to or after contacts 150, 152. Though a finite number of interconnects are depicted, carrier 105 may include a greater number of interconnects than the number depicted. When viewing carrier 110 normal to surface 111, the shape of contacts 150, 152, 154 may be polygonal (i.e., square, rectangular, or the like). Similarly, when viewing carrier 110 normal to surface 113, the shape of contacts 172, may also be polygonal. In some embodiments, contacts 154 and 172 may be connected to circuit wiring lines within carrier 110.

Figure 28:
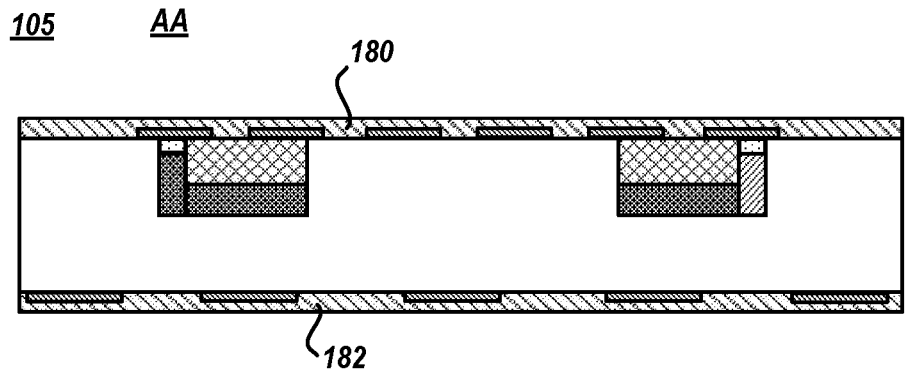

FIG. 28 depicts a cross section view AA of integrated memory IC chip carrier 105 at a subsequent fabrication stage. At the present fabrication stage, a solder mask 180 is formed upon chip facing surfaces of material 185, memory 120, and carrier 110 and is formed surrounding contacts 150, 152, and 154. In other words, solder mask 180 may blanket cover the features of carrier 105 on the side of carrier 105 that faces the IC chip. At the present fabrication stage, a solder mask 182 is formed upon system facing surfaces of material 140 and carrier 110 and is formed surrounding contacts 172. In other words, solder mask 182 may blanket cover the features of carrier 105 on the side of carrier 105 that faces the system.

Figure 29:
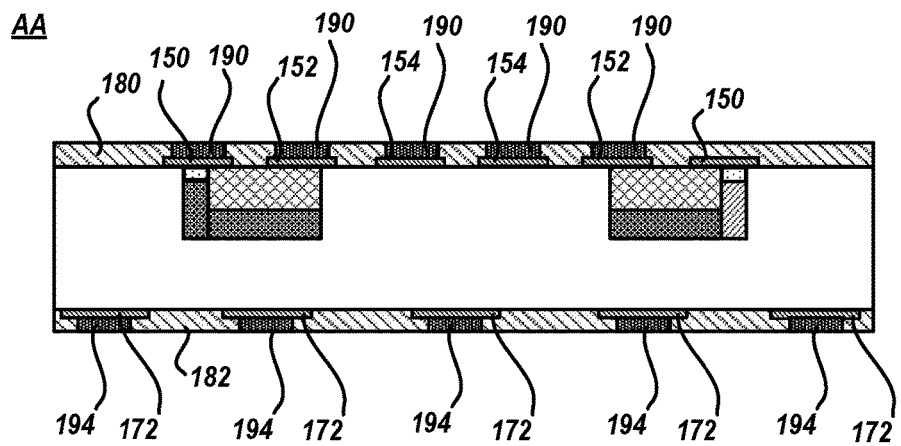

FIG. 29 depicts a cross section view AA of integrated memory IC chip carrier 105 at a subsequent fabrication stage. At the present fabrication stage, solder masks 180, 182 are opened in line with contacts 152, 154, and 172 and pre-solder material is formed within the openings. For example, openings within solder mask 180 are formed above contacts 152, 154 and openings within solder mask 182 are formed below contacts 172. Subsequently, pre-solder material 190 is formed within the openings in line with contacts the associated contact. For clarity, the fabrication stages depicted in FIG. 28 and FIG. 29 may be optional in implementations of carrier 105 that connect to the IC chip or system by non-solder type interconnects, such as fuzzy buttons, posts, grid, or the like.

FIG. 30 depicts a cross section view of integrated memory IC chip carrier 105 within IC chip package 205 or within a system 305. IC chip package 205 includes carrier 105 connected to IC chip 202. System 300 includes IC chip package 205 connected to a system board 302.

IC chip 202 may be connected to carrier 105 by interconnects 210, such as solder, C4 solder, buttons, posts, or the like that connect a contact of the IC chip 202 to pre-solder 190 or, if no pre-solder 190 is present, directly to contact 154 of carrier 105. For example, as depicted, IC chip contact 204 is connected to pre-solder 190 by its C4 solder interconnect 210, IC chip contact 206 is connected to pre-solder 190 by its C4 solder interconnect 210, IC chip contact 208 is connected to pre-solder 190 by its C4 solder interconnect 210, IC chip contact 212 is connected to pre-solder 190 by its C4 solder interconnect 210, and IC chip contact 214 is connected to pre-solder 190 by its C4 solder interconnect 210.

IC chip contact 204 is electrically connected to carrier 110 by way of contact 150, IC chip contact 206 is electrically connected to carrier 110 by way of its contact 152, IC chip contact 208 is electrically connected to wiring 135 within carrier 110 by way of its contact 154, IC chip contact 212 is electrically connected to wiring 137 within carrier 110 by way of its contact 154, and IC chip contact 214 is electrically connected to carrier 110 by way of its contact 152. Therefore, to access the left memory 120, IC chip 202 may directly send an access instruction or signal from the appropriate contact 206 to contact 122 by way of contact 210 and to access the right memory 120, IC chip 202 may directly send an access instruction or signal from the contact 214 to contact 122 by way of contact 210. Wiring 139 may be electrically connected with contact 150 that is connected to one memory 120.

IC chip package 205 may be connected to system board 302 by interconnects 320, such as solder, solder, buttons, posts, or the like that connect a contact of the system board 302 to pre-solder 192, 194 or, if no pre-solder 192, 194 is present, directly to contact 172 of carrier 105. For example, as depicted, system board contact 304 is connected to pre-solder 170 by solder interconnect 320, system board contact 306 is connected to pre-solder 172 by solder interconnect 320, system board contact 308 is connected to pre-solder 172 by solder interconnect 320, system board contact 310 is connected to pre-solder 172 by solder interconnect 320, and system board contact 312 is connected to pre-solder 170 by solder interconnect 320.

System board contact 304 may be electrically connected to wiring 171 within carrier 110 by way of its contact 172, system board contact 306 may be electrically connected to wiring 173 within carrier 110 by way of its contact 172, system board contact 308 may be electrically connected to wiring 175 within carrier 110 by way of its contact 172, system board contact 310 may be electrically connected to wiring 177 within carrier 110 by way of its contact 172, and system board contact 312 may be electrically connected to wiring 179 within carrier 110 by way of its contact 172. Wiring lines 171, 173, 175 may be electrically connected to a wiring line 135, 137.

To provide power potential to the left memory 120, IC chip 202 may directly provide power potential to chip contact 204 to contact 126 by way of contact 210. For clarity, to provide ground potential to the left memory 120, IC chip 202 may further directly provide ground potential to the appropriate IC chip contact that is connected to chip contact to contact 124 of the left memory 120. To provide ground potential to the right memory 120, IC chip 202 may provide ground potential from a wiring line 135, 137 to wiring line 139 or system board 302 may supply ground potential from wiring line 171, 173, 175, 177, or 179 to wiring line 139. For clarity, to provide power potential to the left memory 120, system board 302 may further provide power potential to the appropriate IC chip contact that is connected to a wiring line that is connected to contact 126 of the right memory 120. In this manner, either the system board 302 or the IC chip 202, alone or in combination, may supply power and/or ground potential to any one or more memories 120.

Figure 31:
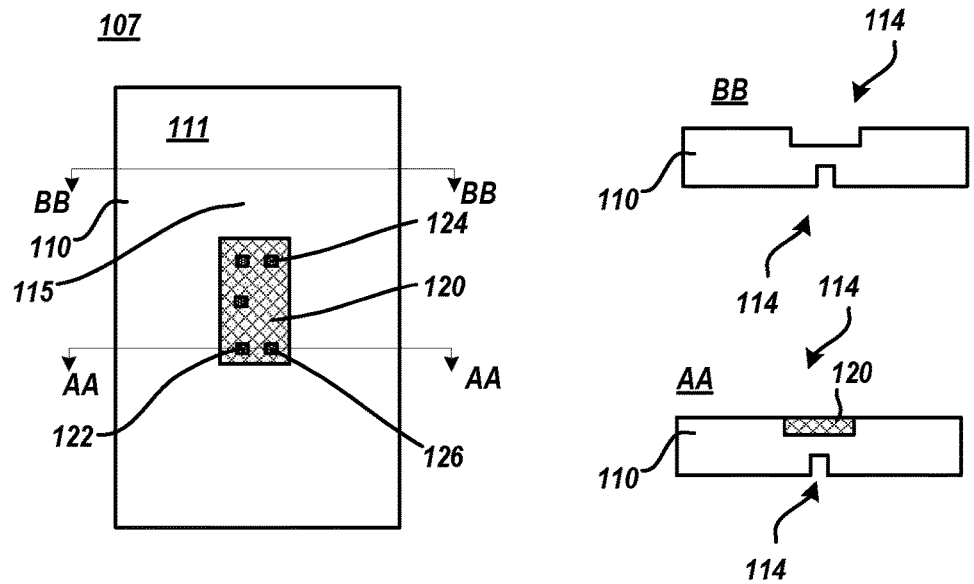
FIG. 31 depicts views of an exemplary integrated memory IC chip carrier fabrication stage, in accordance with one or more embodiments of the present invention.

FIG. 31 depicts views of an exemplary integrated memory IC chip carrier 107 at an initial fabrication stage. At the present fabrication stage carrier 107 includes carrier 110, one or more memories 120 a stiffer, such as stiffener 187 shown in FIG. 32, that stiffens carrier 110 to reduce carrier 110 warpage. One view of FIG. 31 depicts chip surface 111 of carrier 110, a contact surface 121 of memory 120, a plane AA through memory 120 and through carrier 110, and a plane BB through carrier 110. An IC chip and carrier 110 may be positioned relative thereto so that chip surface 111 faces the IC chip and that the system surface 113 faces the higher-level system, such as a motherboard. Another view of FIG. 31 depicts a cross section of carrier 110 and memory 120 at plane AA. Yet another view of FIG. 31 depicts a cross section of carrier 110 at plane BB.

Carrier 110 may include multiple cutouts, notches, recesses, or the like, herein denoted as recesses 114 that extends inwards into carrier 110 from chip surface 111 and from system surface 113, respectively. One recess 114 may be configured to accept or juxtapose with memory 120. This recess 114 may be formed to a depth so that the contact surface 121 of memory 120 is coplanar with IC chip surface 111 of carrier 110. This recess 114 may be formed to a width such that sidewalls of memory 120 are juxtaposed with sidewalls of the recess 114. Though a heat spreader in contact with memory 120 is not shown, a heat spreader may be positioned below memory 120 in contact with surface 127 between memory 120 and carrier 110 within recess 114.

Figure 32:
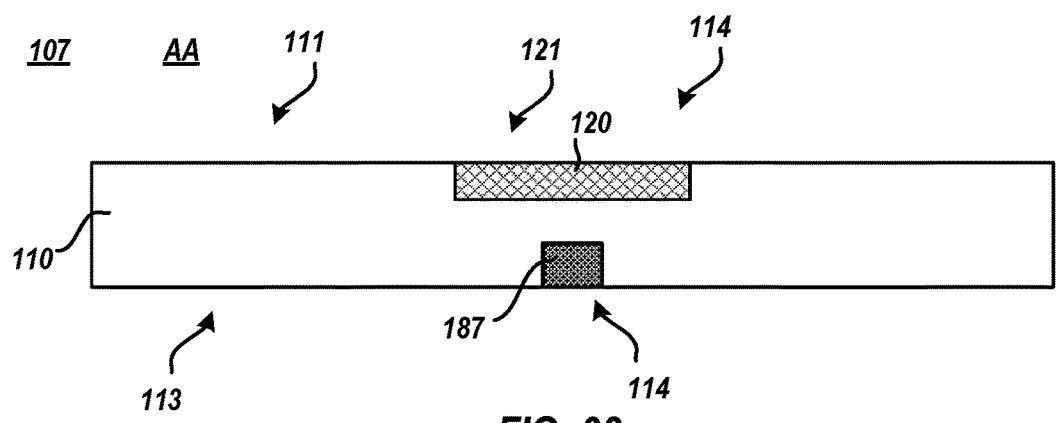
FIG. 32-FIG. 35 depict cross section view of exemplary integrated memory IC chip carrier fabrication stages, in accordance with one or more embodiments of the present invention.

FIG. 32 depicts a cross section view AA of integrated memory IC chip carrier 107 at a subsequent fabrication stage. At the present fabrication stage, stiffener 187 is positioned within the recess 114 associated with system surface 113 of carrier 110. Stiffener 187 is a material with a greater resistance to warpage relative to the makeup of materials of carrier 110. For example, stiffener 187 may be a metal, glass, or the like. Recess 114 associated with surface 113 may be configured to accept or juxtapose with stiffener 187. This recess 114 may be formed to a depth so that the system facing surface of stiffener 187 is coplanar with system surface 113. This recess 114 may be formed to a width such that sidewalls of stiffener 187 are juxtaposed with sidewalls of this recess 114.

Figure 33:
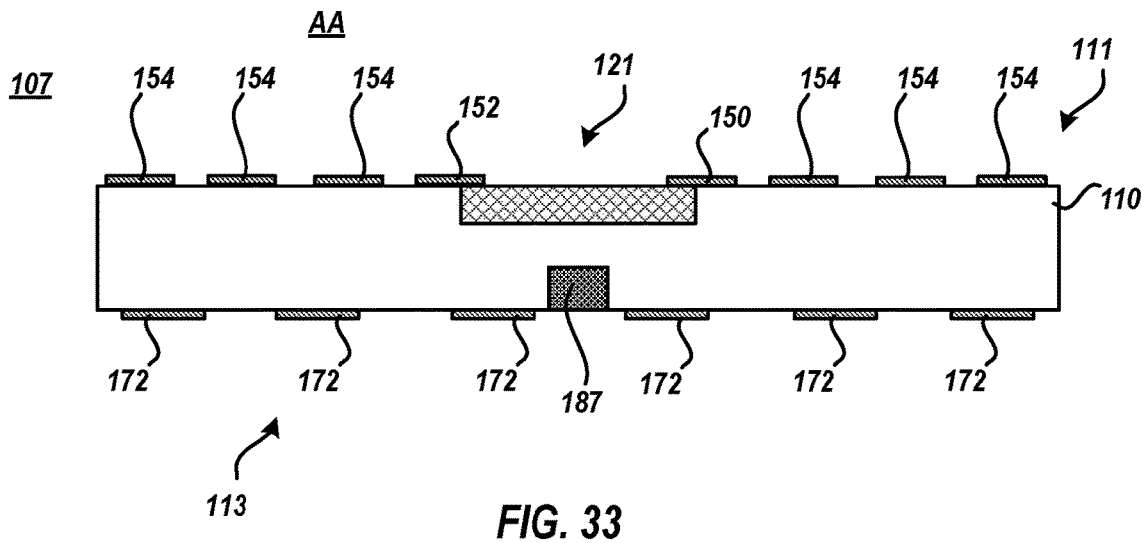

FIG. 33 depicts a cross section view AA of integrated memory IC chip carrier 107 at a subsequent fabrication stage. At the present fabrication stage, interconnects are formed. The interconnects are electrically conductive pathways and may be contacts, pads, vias, or the like. Interconnects may be formed upon the chip facing surfaces memory 120 and carrier 110. For example, contacts 154 may be formed upon chip surface 111. Likewise, contact 152 may be formed upon chip surface 111, upon surface 121, and upon signal contact 122 of memory 120. Likewise, contact 150 may be formed upon surface 121, and upon power contact 126 or ground contact 124 of memory 120. Interconnects may also be formed upon system facing surfaces of material 140 and carrier 110. For example, contacts 172 may be formed upon system surface 113.

Such interconnects may be formed by known fabrication techniques. For example, a dielectric layer may be formed upon the IC chip facings surface of carrier 107 and upon the system facing surfaces of carrier 107. The dialectic layers may be patterned, or in other words, openings may be formed therein where the interconnects are to be formed. The interconnects may be formed within the openings via sputtering, plating, or other known deposition techniques. The dielectric layers are removed leaving the formed interconnects upon the IC chip facings surface of carrier 107 and formed upon the system facing surfaces of carrier 107. The formation of the various interconnects may be completed in stages. For example, contacts 154, 172 may be formed prior to or after contacts 150, 152. Though a finite number of interconnects are depicted, carrier 107 may include a greater number of interconnects than the number depicted. When viewing carrier 110 normal to surface 111, the shape of contacts 150, 152, 154 may be polygonal (i.e., square, rectangular, or the like). Similarly, when viewing carrier 110 normal to surface 113, the shape of contacts 172, may also be polygonal. In some embodiments, contacts 150, 152, 154, and 172 may be connected to circuit wiring lines within carrier 110.

Figure 34:
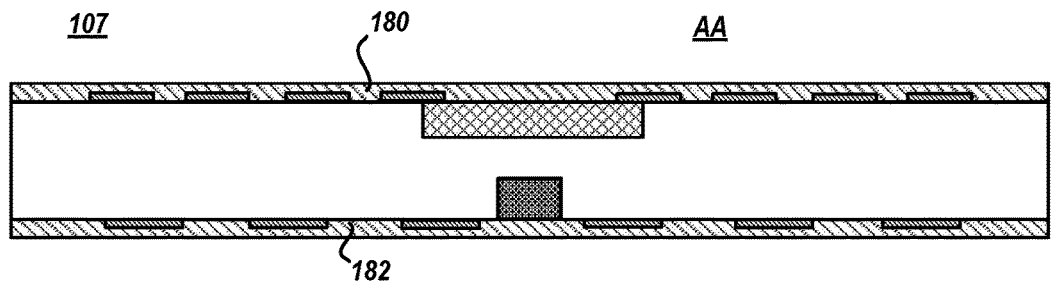

FIG. 34 depicts a cross section view AA of integrated memory IC chip carrier 107 at a subsequent fabrication stage. At the present fabrication stage, a solder mask 180 is formed upon chip facing surfaces memory 120 and carrier 110 and is formed surrounding contacts 150, 152, and 154. In other words, solder mask 180 may blanket cover the features of carrier 107 on the side of carrier 107 that faces the IC chip. At the present fabrication stage, a solder mask 182 is formed upon system facing surfaces of material 140 and carrier 110 and is formed surrounding contacts 172. In other words, solder mask 182 may blanket cover the features of carrier 107 on the side of carrier 107 that faces the system.

Figure 35:
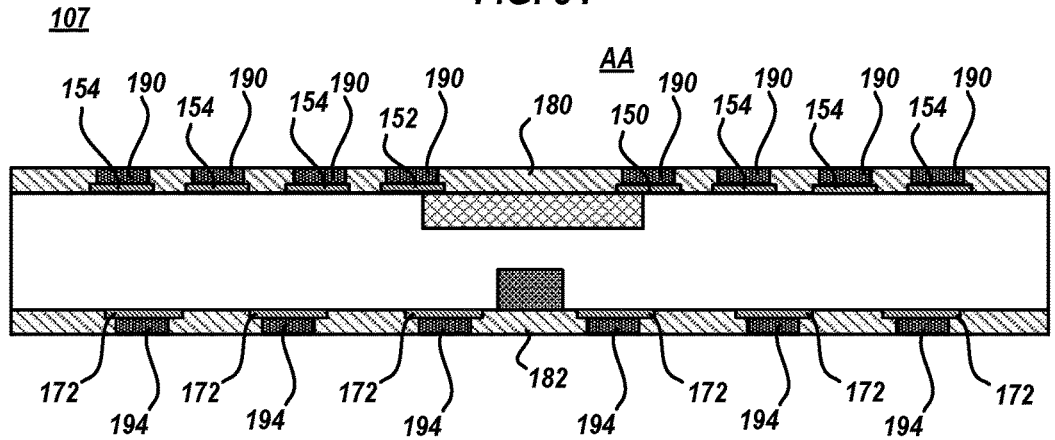

FIG. 35 depicts a cross section view AA of integrated memory IC chip carrier 107 at a subsequent fabrication stage. At the present fabrication stage, solder masks 180, 182 are opened in line with contacts 152, 154, and 172 and pre-solder material is formed within the openings. For example, openings within solder mask 180 are formed above contacts 152, 154 and openings within solder mask 182 are formed below contacts 172. Subsequently, pre-solder material 190 is formed within the openings in line with contacts the associated contact. For clarity, the fabrication stages depicted in FIG. 34 and FIG. 35 may be optional in implementations of carrier 107 that connect to the IC chip or system by non-solder type interconnects, such as fuzzy buttons, posts, grid, or the like.

Figure 36:
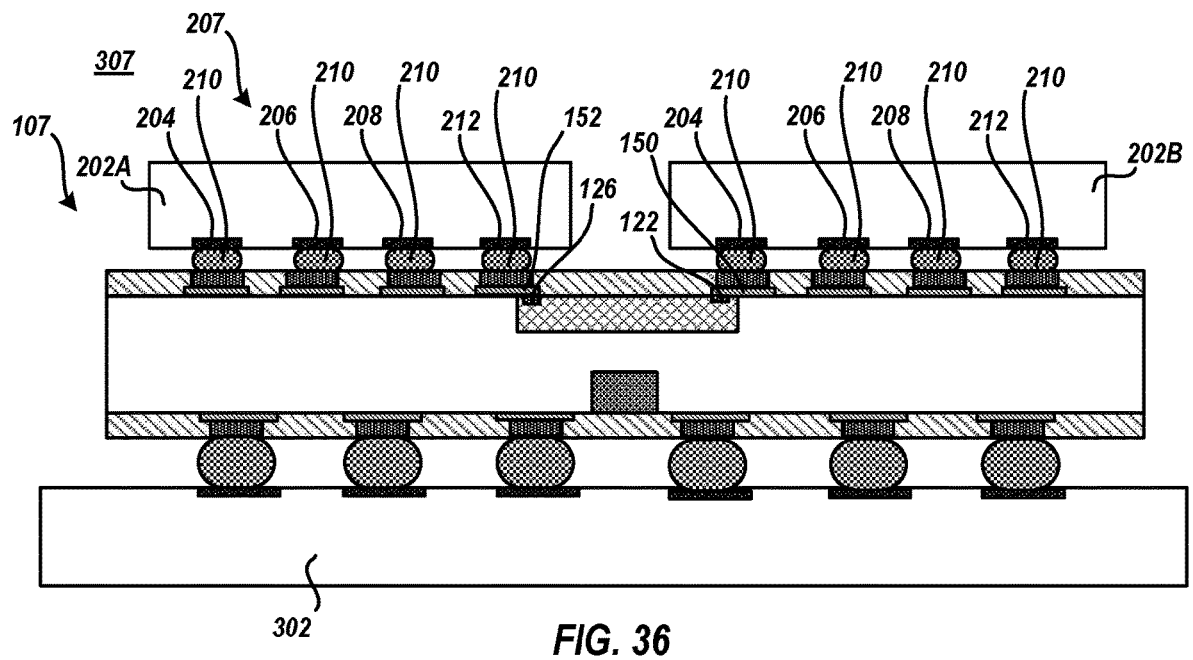
FIG. 36 depicts a cross section view of an exemplary integrated memory IC chip carrier within a higher-level IC chip package or within a higher level electronic system, in accordance with one or more embodiments of the present invention.

FIG. 36 depicts a cross section view of integrated memory IC chip carrier 107 within IC chip package 207 or within a system 307. IC chip package 207 includes carrier 107 connected to two different IC chips, depicted as a left chip 202A and a right chip 202B. System 300 includes IC chip package 207 connected to a system board 302.

The IC chips 202A, 202B may be connected to carrier 107 by respective interconnects 210, such as solder, C4 solder, buttons, posts, or the like that connect a contact of the IC chip 202 to pre-solder 190 or, if no pre-solder 190 is present, directly to contact 154 of carrier 107.

The left IC chip 202A includes a contact 212 that is connected to power contact 126 of memory 120 and/or another contact in a different plane into and out of the page that is connected to ground contact 124 of memory 120. The right IC chip 202B includes one or more contacts (i.e. contact 204) that is connected to signal contact 122 of memory 120. In other words, a first IC chip 202 provides access signals to memory 120 (i.e. writes or reads data to or from memory 120) while another IC chip 202 provides power and/or ground potential to memory 120.

Figure 37:
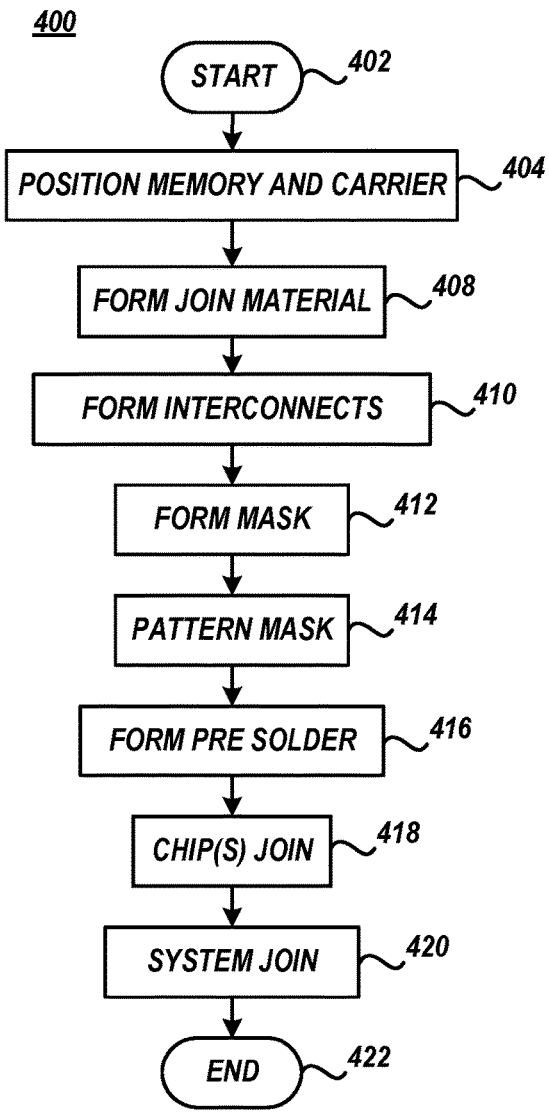
FIG. 37 depicts an exemplary integrated memory IC chip carrier fabrication flow diagram, in accordance with one or more embodiments of the present invention.

FIG. 37 depicts an exemplary integrated memory IC chip carrier fabrication method 400. Method 400 may be utilized to fabricate a IC chip package 200, 201, 203, 205, 207, or the like or to fabricate a higher-level system, such as a mother board or system board, that contains the IC chip package.

Method 400 begins at block 402 and continues with positioning carrier 110 and one or more memories 120 (block 404). For example, multiple memories 120 are positioned relative to carrier 110 such that connector surface 121 of memories 120 are coplanar with the IC chip surface 111 of carrier 110. The memories 120 and carrier 110 may be positioned within form 130.

In some embodiments, a stiffener and/or heat spreader is also positioned relative to memory 120 and or carrier 110. For example, multiple memories 120 are positioned relative to carrier 110 such that connector surface 121 of memories 120 are coplanar with the IC chip surface 111 of carrier 110 and a SHS 115, 117 or a MMHS may be positioned upon a surface 127 and/or sidewall of one or more memories 120. The memories 120, carrier 110, and the stiffener and/or heat spreader may be positioned within form 130. In these implementations, a thermal interface material may be applied between the memories 120 and the heat spreader.

In some embodiments, the memory 120 is positioned within a recess 114 of carrier 114 such that the contact surface 121 of memories 120 are coplanar with IC chip surface 111 of carrier 110. Further, a heat spreader may also be positioned with one or more recesses 114 of carrier.

Method 400 may continue with forming material that joins the memories 120 and the carrier 110 (block 408). For example, material 141, 185 is formed. Material 141 may be formed by injecting material within mold 130 thereby joining the memories 120, carrier 110, and heat spreader and/or stiffer (if present). Material 185 may be deposited upon the heat spreader and may contact a sidewall of one or more memories 120 and a sidewall of carrier 110, thereby joining the heat spreader, memory 120, and carrier 110.

In some embodiments, a VIA hole 142 may be formed within material 141 or may be formed within material 141 and within the heat spreader and/or stiffener. A liner 144 may be formed within the hole 142 that extends through the heat spreader and/or stiffener.

Method 400 may continue with forming interconnects on or within the carrier 110 (block 410). For example, contacts 150, 152, 154, or the like may be formed on the IC chip facing surface 111 of carrier 110 and contacts 170, 172, or the like may be formed on the system facing surface 113 of carrier 110. VIAs 160 may be formed within carrier 110. Contacts 150, 152 are therein electrically connected memory 120 contacts (e.g. signal contact 122, power contact 126, ground contact 124). Contact 150 may be electrically connected to VIA 160 and may be electrically connected to a system board contact 170. Alternatively, contact 150 may be electrically connected to one memory 120 contact. In some embodiments, one of more VIAs 160 are formed within holes 142 within the carrier 110 and a contact 150 and a contact 170 may be formed thereupon.

Method 400 may continue with forming a mask upon the IC chip facing surfaces of the carrier and upon the system facing surfaces of the carrier (block 412). For example, mask 180 is formed to a thickness to cover the features on the IC chip facing surfaces of the carrier and mask 182 is formed to a thickness to cover the features on the system facing surfaces of the carrier.

Method 400 may continue with patterning the mask upon the IC chip facing surfaces of the carrier and patterning the mask upon the system facing surfaces of the carrier (block 414). For example, openings are formed within the mask 180, 182 inline above or below contacts 150, 152, 154, 170, 172, or the like, as appropriate.

Method 400 may continue with forming pre-solder material 190 within the patterned openings of the mask upon the IC chip facing surfaces of the carrier and forming pre-solder material 192, 194 within the patterned openings of the mask upon the system facing surfaces of the carrier (block 416).

Method 400 may continue with joining one or more IC chips 202 to the carrier 110 to form the IC chip package (block 418). For example, an IC chip 202 is joined to the carrier by interconnects 210 that connect a IC chip contact with a carrier contact, such as shown in FIG. 30. In these embodiments, one IC chip contact may be directly connected to the carrier contact that is connected with signal contacts 122 of memory 120 and another IC chip contact may be direct connected to the carrier contact that is connected with power contact 126 or ground contact 124 of memory 120. Alternatively, one IC chip contact may be indirectly connected to the carrier contact that is connected with signal contacts 122 of memory 120 by way of wiring within the carrier 110 and another IC chip contact may be direct connected to the carrier contact that is connected with power contact 126 or ground contact 124 of memory 120 by way of wiring within the carrier 110.

Method 400 may continue with joining the IC chip package to a system board or mother board (block 420). For example, IC chip package 200, 201, 203, 205, 207 is joined to a system board 302 by interconnects 320. A system board contact may be connected to the VIA 160 that is connected to the carrier contact that is connected with power contact 126 or ground contact 124 of memory 120. A system board contact may be connected to carrier 110 wiring that is connected to the carrier contact that is connected with power contact 126 or ground contact 124 of memory 120. Method 400 ends at block 422.

Figure 38:
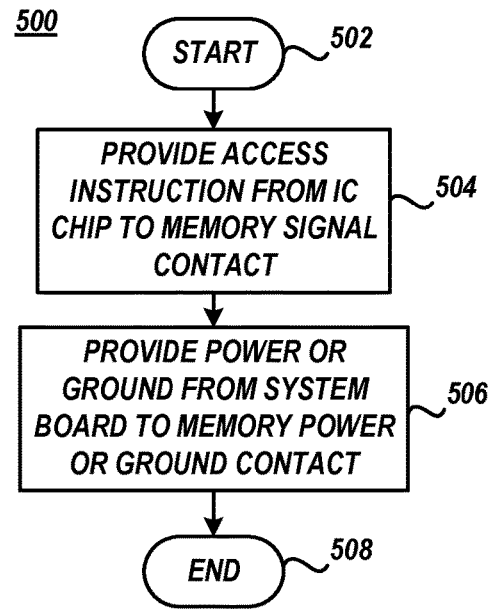
FIG. 38 and FIG. 39 depict exemplary methods of accessing, powering, and/or grounding a memory of integrated memory IC chip carrier, in accordance with one or more embodiments of the present invention.

FIG. 38 depicts a method 500 of accessing, powering, and/or grounding memory 120 of integrated memory IC chip carrier 110. Method 500 may be utilized by system 300, 301, 303, 305, 307 for processor 202 to access memory 120 (i.e. write data to memory 120 or read data from memory 120) and for system board 302 to power and/or ground memory 120. Method 500 begins at block 502 and continues with processor 202 providing an access instruction to memory 120 by way of an IC chip contact that is electrically connected to signal contact 122 of memory 120 to access memory 120 (block 504). A write instruction may contain data to be written to memory 120 and an address of one or more storage circuits within memory 120 to which to store the data. A read instruction may contain the address of one or more storage circuits within memory 120 to which to obtain data previously written. Upon receipt of the access instruction, memory 120 may store the data from IC chip 202 or return the data to IC chip 202 as appropriate. Method 500 may continue with system board 302 supplying power potential to a system board contact that is electrically connected to power contact 126 of memory 120 and/or supplying ground potential to a system board contact that is electrically connected to ground contact 124 of memory 120 (block 506). Method 500 ends at block 508.

Figure 39:
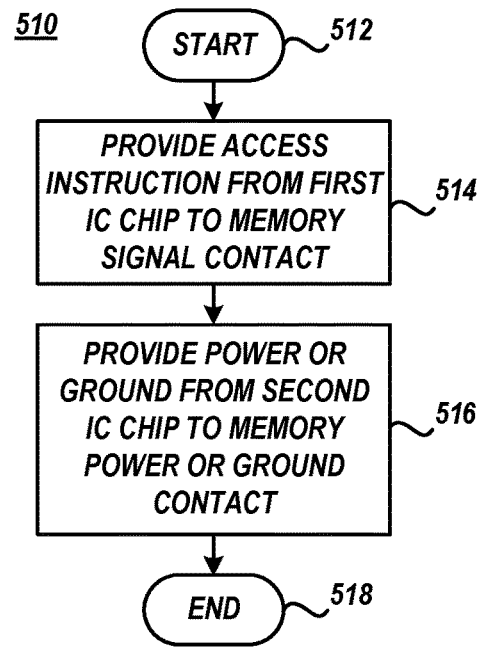

FIG. 39 depict a method 510 of accessing, powering, and/or grounding a memory of integrated memory IC chip carrier, in accordance with one or more embodiments of the present invention. Method 510 may be utilized by system 300, 301, 303, 305, 307 for processor 202A to access memory 120 (i.e. write data to memory 120 or read data from memory 120) and for processor 202B to power and/or ground memory 120. Method 510 begins at block 512 and continues with processor 202A providing an access instruction to memory 120 by way of an IC chip contact that is electrically connected to signal contact 122 of memory 120 to access memory 120 (block 514). A write instruction may contain data to be written to memory 120 and an address of one or more storage circuits within memory 120 to which to store the data. A read instruction may contain the address of one or more storage circuits within memory 120 to which to obtain data previously written. Upon receipt of the access instruction, memory 120 may store the data from IC chip 202A or return the data to IC chip 202A as appropriate. Method 510 may continue with IC chip 202B supplying power potential to a IC chip contact that is electrically connected to power contact 126 of memory 120 and/or supplying ground potential to a IC chip contact that is electrically connected to ground contact 124 of memory 120 (block 516). Method 510 ends at block 518.

For clarity, features depicted in one FIG. may be included in embodiments depicted in other FIGs, as appropriate. For example, a liner 144 may be included in embodiments depicted in FIG. 1-FIG. 9, or the like. The carrier 110 in FIG. 1-FIG. 9 may include one or more trenches 114, or the like.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a carrier, with leads that are affixed to a motherboard or other higher level carrier) or in a multichip package (e.g., a carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise, or in addition to that described herein, "forming," "depositing," "deposited," etc. may include, if appropriate, any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as may be used herein is defined as a plane parallel to the conventional plane or surface of carrier 110, regardless of the actual spatial orientation of the carrier 110. The term "vertical" refers to a direction perpendicular to the horizontal, as just defined. Terms, such as "on", "above", "below", "side" (as in "sidewall"), "higher", "lower", "over", "beneath," "under", "top," "bottom," "left," "right," or the like, are used with respect to the horizontal plane. It is understood that various other frames of reference may be employed for describing the present invention without departing from the spirit and scope of the present invention.

What is claimed is:

1. A method of accessing a memory within an integrated circuit (IC) device carrier, the memory joined to the IC device carrier by a dielectric material such that a contact surface of the memory is coplanar with a top surface of the dielectric material and coplanar with a top surface of the IC device carrier, the method comprising:
   sending, with an IC device connected to the top surface of the IC device carrier, an access instruction to store data within the memory through a first carrier interconnect, the first carrier interconnect directly upon the contact surface of the memory, directly upon the top surface of the dielectric material, and directly upon the top surface of the IC device carrier, wherein the first carrier interconnect electrically connects a signal contact of the memory and a wiring line within the IC device carrier; and
   providing, with a system board connected to a bottom surface of the IC device carrier, power potential through a second carrier interconnect directly upon the top surface of the dielectric material, wherein the second carrier interconnect electrically connects a power contact of the memory and a vertical interconnect access (VIA) that extends through the dielectric material.

2. The method of claim 1, further comprising:
   storing the data within the memory.

3. A method of accessing a memory within an integrated circuit (IC) device carrier, the memory joined to the IC device carrier by a dielectric material such that a contact surface of the memory is coplanar with a top surface of the dielectric material and coplanar with a top surface of the IC device carrier, the method comprising:
   receiving, with an IC device connected to the top surface of the IC device carrier, data from the memory through a first carrier interconnect, the first carrier interconnect directly upon the contact surface of the memory, directly upon the top surface of the dielectric material, and directly upon the top surface of the IC device carrier, wherein the first carrier interconnect electrically connects a signal contact of the memory and a wiring line within the IC device carrier; and
   providing, with a system board connected to a bottom surface of the IC device carrier, power potential through a second carrier interconnect directly upon the top surface of the dielectric material, wherein the second carrier interconnect electrically connects a power contact of the memory and a vertical interconnect access (VIA) that extends through the dielectric material.

4. A method of accessing a memory within an integrated circuit (IC) device carrier, the memory comprising a contact surface that is coplanar with a top surface of the IC device carrier, the method comprising:
   sending, with a first IC device connected to the top surface of the IC device carrier, an access instruction to store data within the memory through a first carrier interconnect, the first carrier interconnect directly upon the contact surface of the memory and directly upon the top surface of the IC device carrier, wherein the first carrier interconnect electrically connects a signal contact of the memory and a contact of the first IC device; and
   providing, with a second IC device connected to the top surface of the IC device carrier, power potential to the memory through a second carrier interconnect, the second carrier interconnect directly upon the contact surface of the memory and directly upon the top surface of the IC device carrier, wherein the second carrier interconnect electrically connects a power contact of the memory and a contact of the second IC device.

5. The method of claim 4 wherein the memory lays within a recess of the IC device carrier.

* * * * *